(12) United States Patent
Oda et al.

(10) Patent No.: US 11,373,934 B2
(45) Date of Patent: Jun. 28, 2022

(54) BONDING WIRE FOR SEMICONDUCTOR DEVICE

(71) Applicants: NIPPON MICROMETAL CORPORATION, Saitama (JP); NIPPON STEEL Chemical & Material Co., Ltd., Tokyo (JP)

(72) Inventors: Daizo Oda, Saitama (JP); Takashi Yamada, Saitama (JP); Motoki Eto, Saitama (JP); Teruo Haibara, Saitama (JP); Tomohiro Uno, Tokyo (JP)

(73) Assignees: NIPPON MICROMETAL CORPORATION, Saitama (JP); NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 0 days.

(21) Appl. No.: 16/958,633

(22) PCT Filed: Dec. 28, 2017

(86) PCT No.: PCT/JP2017/047331
§ 371 (c)(1),
(2) Date: Jun. 26, 2020

(87) PCT Pub. No.: WO2019/130570
PCT Pub. Date: Jul. 4, 2019

(65) Prior Publication Data
US 2020/0373226 A1    Nov. 26, 2020

(51) Int. Cl.
*H01L 23/49*  (2006.01)
*H01L 23/29*  (2006.01)
*H01L 23/00*  (2006.01)

(52) U.S. Cl.
CPC .............. *H01L 23/49* (2013.01); *H01L 23/29* (2013.01); *H01L 24/05* (2013.01); *H01L 24/45* (2013.01); *H01L 24/48* (2013.01); *H01L 2224/04042* (2013.01); *H01L 2224/45123* (2013.01); *H01L 2224/45144* (2013.01); *H01L 2224/45147* (2013.01); *H01L 2224/45155* (2013.01); *H01L 2224/45164* (2013.01); *H01L 2224/45173* (2013.01); *H01L 2224/45178* (2013.01)

(58) Field of Classification Search
CPC . H01L 2224/45147; H01L 2224/45164; H01L 2224/45664
See application file for complete search history.

(56) References Cited

U.S. PATENT DOCUMENTS

| | | |
|---|---|---|
| 2013/0180757 A1 | 7/2013 | Uno et al. |
| 2014/0010705 A1* | 1/2014 | Kanou ................. H01L 24/45 420/491 |
| 2016/0078980 A1 | 3/2016 | Sarangapani et al. |
| 2017/0125135 A1 | 5/2017 | Amano et al. |
| 2017/0194280 A1* | 7/2017 | Oda ..................... C22C 5/04 |
| 2017/0200689 A1* | 7/2017 | Yamada ................ C22C 9/04 |
| 2017/0216974 A1 | 8/2017 | Yamada et al. |
| 2018/0122765 A1 | 5/2018 | Oda et al. |
| 2018/0374815 A1 | 12/2018 | Oyamada et al. |

FOREIGN PATENT DOCUMENTS

| | | |
|---|---|---|
| CN | 105393352 A | 3/2018 |
| JP | S61-020693 A | 1/1986 |
| JP | S61-048543 A | 3/1986 |
| JP | 2005-167020 A | 6/2005 |
| JP | 2012-036490 A | 2/2012 |
| JP | 2014-075458 A | 4/2014 |
| JP | 5893230 B1 | 3/2016 |
| JP | 5912005 B1 | 4/2016 |
| JP | 5912008 B1 | 4/2016 |
| JP | 5937770 B1 | 6/2016 |
| JP | 5964534 B1 | 8/2016 |
| JP | 5985127 B1 | 9/2016 |
| JP | 6002337 B1 | 10/2016 |
| JP | 6002337 B1 * | 10/2016 ............. B32B 15/00 |

(Continued)

OTHER PUBLICATIONS

Japanese Notice of Reasons for Refusal issued in corresponding Japanese Patent Application No. 2016-220310, dated Mar. 30, 2018, with English translation.

(Continued)

*Primary Examiner* — Amar Movva
(74) *Attorney, Agent, or Firm* — McDermott Will & Emery LLP

(57) ABSTRACT

Provided is a Pd coated Cu bonding wire for a semiconductor device capable of sufficiently obtaining bonding reliability of a ball bonded portion in a high temperature environment of 175° C. or more, even when the content of sulfur in the mold resin used in the semiconductor device package increases.

The bonding wire for a semiconductor device comprises a Cu alloy core material; and a Pd coating layer formed on a surface of the Cu alloy core material; and contains 0.03 to 2% by mass in total of one or more elements selected from Ni, Rh, Ir and Pd in the bonding wire and further 0.002 to 3% by mass in total of one or more elements selected from Li, Sb, Fe, Cr, Co, Zn, Ca, Mg, Pt, Sc and Y. The bonding wire can be sufficiently obtained bonding reliability of a ball bonded portion in a high temperature environment of 175° C. or more, even when the content of sulfur in the mold resin used in the semiconductor device package increases by being used.

13 Claims, No Drawings

(56) References Cited

FOREIGN PATENT DOCUMENTS

| | | | |
|---|---|---|---|
| JP | 2017-5256 | A | 1/2017 |
| JP | 2017-028262 | A | 2/2017 |
| JP | 2017-38062 | A | 2/2017 |
| TW | 201230963 | A | 7/2012 |
| TW | 201714186 | A | 4/2017 |
| TW | 201716592 | A | 5/2017 |
| TW | 201723196 | A | 7/2017 |
| WO | 2015/163297 | A1 | 10/2015 |
| WO | 2017/104153 | A1 | 6/2017 |

OTHER PUBLICATIONS

Japanese Notice of Reasons for Refusal issued in corresponding Japanese Patent Application No. 2016-220310, dated Jul. 9, 2018, with English translation.

Japanese Decision to Grant a Patent issued in corresponding Japanese Patent Application No. 2016-220310, dated Oct. 24, 2018, with English translation.

Korean Notification of Reasons for Refusal issued in corresponding Korean Patent Application No. 10-2019-7030252, dated Oct. 31, 2019, with English translation.

Korean Notice of Final Rejection issued in corresponding Korean Patent Application No. 10-2019-7030252, dated Mar. 4, 2020, with English translation.

Korean Notice of Final Rejection issued in corresponding Korean Patent Application No. 10-2019-7030252, dated May 11, 2020, with English translation.

German Office Action issued in corresponding German Patent Application No. 1120170003466, dated Jun. 1, 2020, with English translaiton.

International Search Report issued in International Patent Application No. PCT/JP2017/047331, dated Mar. 27, 2018, with English translation.

Korean Decision of Rejection for Amendment issued in corresponding Korean Patent Application No. 10-2019-7030252, dated May 11, 2020, with English translation.

Notice of Reason for Refusal issued in corresponding Korean Patent Application No. 10-2020-7016488, dated Jun. 22, 2020, with English translation.

Taiwanese Office Action issued in corresponding Taiwanese Application No. 107100452, dated May 12, 2021, with English translation.

* cited by examiner

BONDING WIRE FOR SEMICONDUCTOR DEVICE

CROSS REFERENCE TO RELATED APPLICATION

This patent application is the U.S. National Phase under 35 U.S.C. § 371 of International Application No. PCT/JP2017/047331, filed on Dec. 28, 2017, which designates the United States, the entire contents of which are incorporated herein by reference.

TECHNICAL FIELD

The present invention relates to a bonding wire for a semiconductor device used to connect electrodes on a semiconductor element and wiring of a circuit wiring board such as outer leads.

BACKGROUND ART

Currently, as a bonding wire for a semiconductor device connecting between electrodes on a semiconductor element and outer leads (hereinafter referred to as a "bonding wire"), thin wires with a wire diameter of about 15 to 50 μm are mainly being used. A method for bonding the bonding wire is generally a thermal compressive bonding technique with the aid of ultrasound, which uses a general-purpose bonder, a capillary tool used for bonding by passing the bonding wire therethrough, and the like. A bonding process of a bonding wire is carried out by heating and melting a tip of wire by arc heat input to form a ball (FAB: free air ball) through surface tension; crimp-bonding the ball part onto an electrode of the semiconductor element heated within a range of 150 to 300° C. (hereinafter referred to as "ball bonding"); forming a loop; and finally crimp-bonding a wire part onto an electrode of the outer lead (hereinafter referred to as "wedge bonding"). As bonding counterparts of the bonding wire, an electrode structure in which an alloy mainly containing Al is formed as a film on a Si substrate is used for the electrode on the semiconductor element, whereas an electrode structure plated with Ag or Pd is used for the electrode of the outer lead.

Au, which has been mainly used as a material of the bonding wire, has been being replaced with Cu mainly for LSI use. On the background of recent proliferation of electric vehicles and hybrid vehicles, needs for replacing Au with Cu are increasing also in on-vehicle device use.

As for a Cu bonding wire, there has been proposed a wire using high-purity Cu (purity: 99.99% by mass or more) (for example, Patent Literature 1). Cu has the drawback of being more susceptible to oxidation than Au and has problems in that bonding reliability, ball formability and wedge bondability are inferior. As a method for preventing surface oxidation of a Cu bonding wire, there has been proposed a structure in which a surface of Cu core material is coated with a metal such as Au, Ag, Pt, Pd, Ni, Co, Cr and Ti (Patent Literature 2). There has been also proposed a structure in which a surface of Cu core material is coated with Pd and a surface thereof is coated with Au, Ag, Cu or an alloy thereof (Patent Literature 3).

On-vehicle devices require bonding reliability in a more rigorous high-temperature and high-humidity environment than general electronic devices. In particular, the bonding longevity of a ball bonded portion in which the ball part of the wire is bonded to the electrode is the biggest concern. Several methods for evaluating the bonding reliability in a high-temperature and high-humidity environment have been proposed. The representative evaluation method includes a highly accelerated temperature and humidity stress test (HAST) (a high-temperature and high-humidity environment exposure test). When the bonding reliability of a ball bonded portion is evaluated by HAST, a ball bonded portion to be evaluated is exposed to a high-temperature and high-humidity environment with a temperature of 130° C. and a relative humidity of 85%, and then, the bonding longevity of the ball bonded portion is evaluated by measuring temporal changes in a resistance value of the bonded portion or by measuring temporal changes in shear strength of the ball bonded portion. A bonding longevity of 100 hours or more in HAST with such conditions has recently been required. A mold resin (an epoxy resin) as a package of a semiconductor device contains chlorine (Cl) in its molecular skeleton. In a HAST evaluation condition, Cl in the molecular skeleton hydrolyzes and dissolves as a chloride ion (Cl$^-$). In a case where even a Cu bonding wire having Pd coating layer is bonded to an Al electrode by ball bonding, when a Cu/Al bonding interface is placed in high temperature of 130° C. or more, $Cu_9Al_4$ as an intermetallic compound is formed, $Cu_9Al_4$ undergoes corrosion by Cl dissolved from the mold resin, leading to degradation in the bonding reliability.

Patent Literatures 4 to 8 disclose an invention that retards corrosion reaction to improve bonding reliability in a high temperature and high humidity environment by containing one or more elements selected from the group consisting of Ni, Pd, Pt, In, As, Te, Sn, Sb, Bi, Se, Ga and Ge in a Pd coated Cu wire.

Recently, in on-vehicle semiconductor devices, improvement in the reliability of the ball bonded portion in 175° C. to 200° C. has been required. A mold resin (an epoxy resin) as a package of a semiconductor device contains a silane coupling agent. In a case where a higher adhesiveness is required such as a case of on-vehicle semiconductors that require reliability at higher temperatures, a "sulfur-containing silane coupling agent" is added therein. Sulfur contained in the mold resin is freed under a condition of 175° C. or more, e.g., 175° C. to 200° C. When freed sulfur comes in contact with Cu, Cu drastically corrodes. When the corrosion of Cu occurs in a semiconductor device using Cu bonding wire, a bonding reliability, especially of a ball bonded portion, degrades.

Even in the case where the sulfur-containing silane coupling agent is used in the mold resin used in the semiconductor device package, it is required to secure the bonding reliability of the ball bonded portion in a high temperature environment of 175° C. or more. In order to achieve the object, an invention is disclosed in which various alloy elements are contained in the Cu core material of the Pd coated Cu bonding wire. Patent Literatures 6 to 9 discloses that bonding reliability of a ball bonded portion in a high temperature environment of 175° C. or more can be improved by containing a predetermined amount of one or more elements selected from the group consisting of Pt, Pd, Rh, Ni, As, Te, Sn, Sb, Bi, Se, Ni, Ir, Zn, Rh and In in a Pd coated Cu wire.

It discloses an invention which contains minor constituents in Pd coated Cu bonding wires, in order to realize a good shape of the ball, and to improve the circularity of the shape of the ball bonded portion by improving the crushed shape of the ball bonded portion, when ball bonding is performed using Pd coated Cu bonding wire. In Patent Document 4 to 9, it is possible to realize a good shape of the ball, or to improve the crushed shape of the ball bonded portion by containing 0.0001 to 0.01% by mass (1 to 100 ppm by mass) each of one or more elements selected from the group consisting of P, B, Be, Fe, Mg, Ti, Zn, Ag, Si, Ga, Ge, Ca and La in the wire.

RELATED ART REFERENCE

Patent Literature

Patent Literature 1: JP-A-S61-48543
Patent Literature 2: JP-A-2005-167020
Patent Literature 3: JP-A-2012-36490
Patent Literature 4: Japanese Patent No. 5893230
Patent Literature 5: Japanese Patent No. 5964534
Patent Literature 6: Japanese Patent No. 5912005
Patent Literature 7: Japanese Patent No. 5937770
Patent Literature 8: Japanese Patent No. 6002337
Patent Literature 9: Japanese Patent No. 5912008

SUMMARY OF INVENTION

Problem to be Solved by the Invention

As mentioned above, even in the case where the sulfur-containing silane coupling agent is used in the mold resin used in the semiconductor device package, an improvement in bonding reliability of the ball bonded portion has been realized in a high temperature environment of 175° C. or more by containing various alloy elements in the Cu core material of the Pd coated Cu bonding wire (Patent Literatures 6 to 9).

On the other hand, in recent years, the content of sulfur in the mold resin tends to increase. Conventionally, a commercially available epoxy resin containing a sulfur-containing silane coupling agent has been used. Then, the content of sulfur in the epoxy resin in recent use is higher than in conventional epoxy resin in order to improve the reflow resistance by improving the adhesion of the bonding wire to the lead frame and the semiconductor chip. When the epoxy resin having an increased content of sulfur as described above is used as a mold resin in the semiconductor device package, the present inventors have found that the bonding reliability of the ball bonded portion may not be sufficiently obtained in a high temperature environment of 175° C. or more, even if the inventions described in Patent Literatures 6 to 9 are used.

The present invention is directed to a Pd coated Cu bonding wire, an object thereof is to provide a bonding wire for a semiconductor device capable of sufficiently obtaining bonding reliability of a ball bonded portion in a high temperature environment of 175° C. or more, even when the content of sulfur in the mold resin used in the semiconductor device package increases.

Means for Solving Problem

That is, the summary of the present invention is as follows.
(1) A bonding wire for a semiconductor device, the bonding wire comprising: a Cu alloy core material; and a Pd coating layer formed on a surface of the Cu alloy core material, wherein the bonding wire contains at least one of one or more elements selected from Ni, Rh and Ir (hereinafter referred to as "first alloy element group"), and Pd: 0.05% by mass or more (hereinafter referred to as "first+alloy elements group"), and the total content of the first alloy element group and Pd is 0.03 to 2% by mass when the content of the first alloy element group is evaluated as the content in the bonding wire, and the content of Pd is evaluated in terms of the content in the bonding wire based on the content of Pd in the Cu alloy core material; and
wherein the bonding wire contains 0.002 to 3% by mass in total of one or more elements selected from Li, Sb, Fe, Cr, Co, Zn, Ca, Mg, Pt, Sc and Y (hereinafter referred to as "second alloy element group"); the contents of Ca and Mg in the bonding wire are 0.011% by mass or more respectively when Ca or Mg is contained; the total content of the first alloy element group and Zn is 2.1% by mass or more when Zn is contained.
(2) The bonding wire for a semiconductor device according to (1), wherein a thickness of the Pd coating layer is 0.015 to 0.150 μm.
(3) The bonding wire for a semiconductor device according to (1) or (2), further comprising an alloy skin layer containing Au and Pd on the Pd coating layer.
(4) The bonding wire for a semiconductor device according to (3), wherein a thickness of the alloy skin layer containing Au and Pd is 0.050 μm or less.
(5) The bonding wire for a semiconductor device according to any one of (1) to (4), wherein the bonding wire further contains 0.03 to 3% by mass in total of one or more elements selected from Al, Ga, Ge and In (hereinafter referred to as "third alloy element group").
(6) The bonding wire for a semiconductor device according to any one of (1) to (5), wherein the bonding wire further contains 0.1 to 1000 ppm by mass in total of one or more elements selected from As, Te, Sn, Bi and Se (Sn≤10 ppm by mass, Bi≤1 ppm by mass) (hereinafter referred to as "fourth alloy element group").
(7) The bonding wire for a semiconductor device according to any one of (1) to (6), wherein the bonding wire further contains 0.1 to 200 ppm by mass in total of one or more elements selected from B, P and La (hereinafter referred to as "fifth alloy element group").
(8) The bonding wire for a semiconductor device according to any one of (1) to (7), wherein Cu is present at an outermost surface of the bonding wire.

Effect of the Invention

The present invention can provide a bonding wire for a semiconductor device capable of sufficiently obtaining bonding reliability of a ball bonded portion in a high temperature environment of 175° C. or more, even when the content of sulfur in the mold resin used in the semiconductor device package increases.

EMBODIMENT FOR CARRYING OUT THE INVENTION

Hereinafter, the present invention will be described in detail in accordance with preferred embodiments thereof. In the following, numerical values indicated in relation to a content, a thickness and a ratio represent average values, unless otherwise specified.

The bonding wire of the present invention includes a Cu alloy core material and a Pd coating layer formed on a surface of the Cu alloy core material. When a ball is formed by arc discharge using such a Pd coated Cu bonding wire, an alloy layer having a higher Pd concentration than the inside of the ball is formed on a surface of the ball in a process in which the bonding wire melts and solidifies. When bonding with an Al electrode is performed using this ball, and a high-temperature and high-humidity test is performed, Pd is concentrated in a bonding interface. A concentrated layer formed by the concentrated Pd can reduce the diffusion of Cu and Al in the bonding interface during the high-temperature and high-humidity test and reduce a growth rate of a corrodible compound. With this phenomenon, the Pd coated Cu bonding wire of the present invention can improve the bonding reliability. The alloy layer in which the concentration of Pd is high, formed on the surface of the ball, is excellent in oxidation resistance and can thereby reduce failures such as deviation of a ball forming position relative to the center of the bonding wire when the ball is formed.

Recently, in on-vehicle semiconductor devices, improvement in the reliability of the ball bonded portion in 175° C. to 200° C. has been required. As mentioned above, the mold resin (the epoxy resin) as the package of the semiconductor device contains a silane coupling agent. The silane coupling agent has a function of improving adhesiveness between organic matter (resin) and inorganic matter (silicon or metal) and can thereby improve adhesiveness with a silicon substrate or metal. Furthermore, when higher adhesiveness is required such as on-vehicle semiconductors that require reliability at higher temperatures, a "sulfur-containing silane coupling agent" is added. Sulfur contained in the mold resin is freed when being used on the condition of 175° C. or more (for example, 175° C. to 200° C.). When sulfur freed at a high temperature of 175° C. or more is in contact with Cu, Cu violently corrodes to produce a sulfide ($Cu_2S$) or an oxide (CuO). When the corrosion of Cu is produced in the semiconductor device using the Cu bonding wire, the bonding reliability degrades especially of the ball bonded portion.

As means for evaluating reliability of the ball bonded portion in a high-temperature environment at 175° C. or more, a high temperature storage test (HTS) is used. For a sample to be evaluated exposed to a high-temperature environment, temporal changes in a resistance value of the ball bonded portion are measured, or temporal changes in shear strength of the ball bonded portion are measured, thereby evaluating the bonding longevity of the ball bonded portion.

A bonding wire for a semiconductor device in the present invention, the bonding wire comprising: a Cu alloy core material; and a Pd coating layer formed on a surface of the Cu alloy core material, wherein the bonding wire contains at least one of one or more elements selected from Ni, Rh and Ir (first alloy element group), and Pd: 0.05% by mass or more. The content of the first alloy element group is evaluated as the content in the bonding wire. The content of Pd is evaluated in terms of the content in the bonding wire based on the content of Pd in the Cu alloy core material. That is, the content of Pd can be calculated by analyzing the content of Pd in the Cu alloy core material and multiplying the analysis value by "(Cu alloy core material mass per wire unit length)/(bonding wire mass per wire unit length)". Pd in the Pd coating layer is not added to the content of Pd. The present invention is characterized in that, as the content when evaluated in these manner, the total content of the first alloy element group and Pd is 0.03 to 2% by mass. If the content of sulfur in mold resin used in semiconductor device package is comparable to that of conventional mold resin containing sulfur-containing silane coupling agent, the bonding reliability of the ball bonded portion in a high temperature environment of 175° C. or more can be improved by containing at least one of the first alloy element group and Pd (hereinafter referred to as "first+alloy elements group") in the above content range. This is as described in Patent Literatures 6 to 9 as mentioned above. Furthermore, it is possible to improve the loop formability, that is, the leaning can be reduced which becomes a problem in high density mounting, by containing the first+alloy elements group in the above content range. This is because the yield strength of the bonding wire can be improved and the deformation of the bonding wire can be suppressed by containing these elements in the bonding wire.

In addition, the bonding longevity of ball bonded portion in a high-temperature and high-humidity environment of a temperature of 130° C. and a relative humidity of 85% can also be improved by containing the first+alloy elements group in the above content range. It is considered that the formation of a $Cu_9Al_4$ intermetallic compound in the bonded portion tends to be reduced when the Pd coated Cu bonding wire contains the first+alloy elements group as in the present invention. In a case where these elements are added, interfacial tension between Cu of the core material and Pd of the coating layer decreases which allows Pd to be concentrated in a ball bonded interface effectively. It can be thus estimated that an effect of reducing a mutual diffusion of Cu and Al by the Pd concentrated layer is enhanced, and as a result of that, a formation amount of $Cu_9Al_4$, which is likely to corrode through the action of Cl, is reduced, and then the reliability of the ball bonded portion in a high-temperature and high-humidity environment improves.

The lower limit of the content of the first+alloy elements group consisting of Ni, Rh, Ir and Pd shall be 0.03% by mass in total in the bonding wire as described above. More preferably, the lower limit of the content is 0.05% by mass or more, 0.1% by mass or more, 0.2% by mass or more, 0.3% by mass or more, or 0.5% by mass or more. When Pd is contained, the lower limit of the content of Pd is 0.05% by mass. More preferably, the lower limit of the content of Pd is 0.1% by mass or more, 0.2% by mass or more, 0.3% by mass or more, 0.4% by mass or more, or 0.5% by mass or more. On the other hand, the upper limit of the content of the first+alloy elements group shall be 2% by mass as described above. This is because the FAB hardens and chip cracks are easily induced at wire bonding when the content of the first+alloy elements group exceeds 2% by mass. More preferably, the upper limit of the content is 1.8% by mass or less, or 1.6% by mass or less.

On the other hand, there were cases where the bonding reliability of the ball bonded portion could not be sufficiently obtained in a high temperature environment of 175° C. or more only by containing the first+alloy elements group as described above when the content of sulfur increases in mold resin. In the present invention, this problem could be solved by containing 0.002% by mass or more in total of one or more elements selected from Li, Sb, Fe, Cr, Co, Zn, Ca, Mg, Pt, Sc and Y (second alloy element group) in addition to the first+alloy elements group in the bonding wire. When both the first+alloy elements group and the second alloy element group are contained, the second alloy element group contained therein traps (compounds) sulfur freed from the sealing resin and makes it harmless while sulfur acts on $Cu_9Al_4$ at the bonded portion to develop corrosion, in addition to realizing an effect of containing the first+alloy elements group, that is, the tendency to suppress formation of $Cu_9Al_4$ intermetallic compound susceptible to corrosion by sulfur in the bonded portion. As a result, the bonding strength after HTS can be maintained, by suppressing the developments of corrosion even if $Cu_9Al_4$ is formed. The total content of the second alloy element group is more preferably 0.005% by mass or more, further preferably 0.02% by mass or more, 0.05% by mass or more, 0.1% by mass or more, 0.2% by mass or more, 0.3% by mass or more, or 0.5% by mass or more. In the case where Ca and Mg are contained, the lower limits of the contents of the Ca and Mg are defined as 0.011% by mass respectively, since the above effect is confirmed when the content of Ca and Mg of the second alloy element group is 0.011% by mass or more. That is, in the case where the bonding wire contains Ca, the content of Ca in the bonding wire is 0.011% by mass or more, and in the case where the bonding wire contains Mg, the content of Mg in the bonding wire is 0.011% by mass or more. The lower limits of the contents of Ca and Mg are preferably 0.015% by mass or more, 0.02% by mass or more, 0.03% by mass or more, 0.05% by mass or more, 0.1% by mass or more, 0.2% by mass or more, or 0.3% by mass or more, respectively. On the other hand, the total content of the second alloy element group shall be 3% by mass or less. The FAB hardens and chip cracks are easily induced at wire bonding when the total content of the second alloy element group exceeds 3% by mass. The content of the second alloy element group is more preferably 2.5% by mass or less, 2% by mass or less, 1.8% by mass or less, or 1.6% by mass or less. In the case where Zn is contained as the second alloy element group and the total content of the first alloy element group and Zn is 2.1% by mass or more, the effect of trapping sulfur increases so that further developments of corrosion can be suppressed, in addition to the above effects being obtained. The total content of the first alloy element group and Zn is more preferably 2.5% by mass or more, further preferably 3.0% by mass or more, 3.5% by mass or more.

In one embodiment, the bonding wire of the present invention necessarily contains at least one of Sc and Y as the second alloy element group. In such an embodiment, the bonding wire of the present invention contains at least one of Sc and Y, and the total content of the second alloy element group selected from the group consisting of Li, Sb, Fe, Cr, Co, Zn, Ca, Mg, Pt, Sc and Y is 0.002 to 3% by mass. The preferred ranges of the total content of the second alloy element group, the lower limits of the contents of Ca and Mg, and the total content of the first alloy element group and Zn when Zn is contained are as described above, and the content of at least one of Sc and Y, that is, the total content of Sc and Y is preferably 0.002% by mass or more, 0.005% by mass or more, 0.02% by mass or more, 0.05% by mass or more, 0.1% by mass or more, 0.2% by mass or more, 0.3% by mass or more, or 0.5% by mass or more. In addition, in such an embodiment, the total content of Sc and Y is preferably 2.5% by mass or less, 2% by mass or less, 1.8% by mass or less, or 1.6% by mass or less.

In the bonding wire of the present invention, the thickness of the Pd coating layer is preferably 0.015 μm or more, more preferably 0.02 μm or more, and further preferably 0.025 μm or more, 0.03 μm or more, 0.035 μm or more, 0.04 μm or more, 0.045 μm or more, or 0.05 μm or more in view of further improving the bonding reliability of the ball bonded portion in the high-temperature and high-humidity environment required in on-vehicle devices, and in view of suppressing eccentricity of FAB to obtain more favorable FAB shape. On the other hand, the thickness of the Pd coating layer is preferably 0.150 μm or less and more preferably 0.140 μm or less, 0.130 μm or less, 0.120 μm or less, 0.110 μm or less, or 0.100 μm or less in view of suppressing shrinkage cavities of FAB to obtain favorable FAB shape.

There will be described the definition of the Cu alloy core material and the Pd coating layer of the bonding wire. A boundary between the Cu alloy core material and the Pd coating layer was determined based on a concentration of Pd. The boundary was set to be a position at which a concentration of Pd was 50 at %, and a region in which a concentration of Pd was 50 at % or more was determined to be the Pd coating layer, and a region in which a concentration of Pd was less than 50 at % was determined to be the Cu alloy core material. This is because if a concentration of Pd is 50 at % or more in the Pd coating layer, there can be expected an effect of improving characteristics from the structure of the Pd coating layer. The Pd coating layer may contain a Pd single region and a region having concentration gradients of Pd and Cu in a wire depth direction. The reason why the region having the concentration gradients is formed in the Pd coating layer is that atoms of Pd and Cu may diffuse through heat treatment or the like in a manufacturing process. In the present invention, the concentration gradient refers to the fact that a degree of a change in concentration in the depth direction is 10 mol % or more per 0.1 μm. Furthermore, the Pd coating layer may contain inevitable impurities.

The bonding wire of the present invention may further include an alloy skin layer containing Au and Pd on the Pd coating layer. With this configuration, the bonding wire of the present invention can further improve the wedge bondability.

There will be described the definition of the alloy skin layer containing Au and Pd of the bonding wire. A boundary between the alloy skin layer containing Au and Pd and the Pd coating layer was determined based on a concentration of Au. The boundary was set to be a position at which a concentration of Au was 10 at %, and a region in which a concentration of Au was 10 at % or more was determined to be the alloy skin layer containing Au and Pd, and a region in which a concentration of Au was less than 10 at % was determined to be the Pd coating layer. Even in the region in which a concentration of Pd was 50 at % or more, a region in which Au was present at 10 at % or more was determined to be the alloy skin layer containing Au and Pd. These determinations are because if a concentration of Au falls within the range mentioned above, there can be expected an effect of improving characteristics from the structure of the Au skin layer. The alloy skin layer containing Au and Pd is an Au—Pd alloy and contains a region having concentration gradients of Au and Pd in the wire depth direction. The reason why the region having the concentration gradients is formed in the alloy skin layer containing Au and Pd is that atoms of Au and Pd diffuse through heat treatment or the like in the manufacturing process. Furthermore, the alloy skin layer containing Au and Pd may contain inevitable impurities and Cu.

In the bonding wire of the present invention, the alloy skin layer containing Au and Pd reacts with the Pd coating layer to improve adhesive strength among the alloy skin layer containing Au and Pd, the Pd coating layer and the Cu alloy core material and to prevent the Pd coating layer and the alloy skin layer containing Au and Pd from peeling at wedge bonding. Accordingly, the bonding wire of the present invention can further improve the wedge bondability. If the thickness of the alloy skin layer containing Au and Pd is less than 0.0005 μm, the above effect is not obtained sufficiently, and if the thickness is larger than 0.050 μm, the FAB shape may be eccentric. In view of obtaining favorable wedge bondability, a thickness of the alloy skin layer containing Au and Pd is preferably 0.0005 μm or more, and more preferably 0.001 μm or more, 0.002 μm or more, or 0.003 μm or more. In view of reducing eccentricity to obtain favorable FAB shape, a thickness of the alloy skin layer containing Au and Pd is preferably 0.050 μm or less, and more preferably 0.045 μm or less, 0.040 μm or less, 0.035 μm or less, or 0.030 μm or less. The alloy skin layer containing Au and Pd can be formed by a method similar to that of the Pd coating layer.

The bonding wire of the present invention may further contain 0.03 to 3% by mass in total of one or more elements selected from Al, Ga, Ge and In (third alloy element group). This is preferable because the bonding reliability can be improved in a high-temperature and high-humidity environment of a 130° C. and a relative humidity of 85% which is the HAST evaluation condition. It is thought that the formation of the $Cu_9Al_4$ intermetallic compound at the bonded portion tends to be further suppressed when the Pd coated Cu bonding wire contains the third alloy element group in the above content range. At forming the FAB at the ball bonded portion, the third alloy element group in the wire also diffuses into the Pd coating layer. It seems that the third alloy element group present in the Pd concentrated layer at the interface between Cu and Al in the ball bonded portion further enhances the effect of reducing a mutual diffusion between Cu and Al due to the Pd concentrated layer, and as a result of that, it suppresses the formation of $Cu_9Al_4$ which is likely to corrode in a high-temperature and high-humidity environment. The third alloy element group contained in the wire may also have an effect of directly inhibiting the formation of $Cu_9Al_4$. The total content of the third alloy element group is preferably 0.05% by mass or more, 0.1% by mass or more, 0.2% by mass or more, 0.3% by mass or more, 0.4% by mass or more, or 0.5% by mass or more.

Furthermore, when forming a ball using a Pd coated Cu bonding wire containing third alloy element group in certain amount and observing a resultant FAB with a scanning electron microscope (SEM), many precipitates with a diameter of about a few tens of nanometers are found on a surface of the FAB. From an analysis on the precipitates by energy dispersive X-ray spectroscopy (EDS), it is revealed that third alloy element group was concentrated. Although a detailed mechanism is unclear, it is considered from the above situation that these precipitates observed on the FAB become to be present at the bonding interface between the ball and the electrode, whereby significantly improving a bonding reliability of a ball bonded portion in a high-temperature and high-humidity environment of a temperature of 130° C. and a relative humidity of 85%.

On the other hand, in view of obtaining favorable FAB shape and in view of reducing the hardening of the bonding wire to obtain favorable wedge bondability, the concentration of third alloy element group in total relative to the entire wire is 3% by mass or less, preferably 2% by mass or less, and more preferably 1.5% by mass or less or 1.2% by mass or less.

The bonding wire of the present invention may further contain 0.1 to 1000 ppm by mass in total of one or more elements selected from As, Te, Sn, Bi and Se (Sn≤10 ppm by mass, Bi≤1 ppm by mass) (fourth alloy element group). This is preferable because the bonding reliability can be improved in a high-temperature and high-humidity environment of a temperature of 130° C. and a relative humidity of 85% which is the HAST evaluation condition. It is considered that the formation of the $Cu_9Al_4$ intermetallic compound at the bonded portion tends to be further reduced when the fourth alloy element group is contained in the above content range. In a case where these elements are contained in a certain amount, when a ball is formed, interfacial tension between Cu of the core material and Pd of the coating layer decreases and then interfacial wettability improves, which allows Pd to be concentrated in a ball bonded interface more remarkably. It can be thus estimated that an effect of reducing a mutual diffusion of Cu and Al by the Pd concentrated layer is further enhanced in a high-temperature and high-humidity environment which is the HAST evaluation condition, and as a result of that, a formation amount of $Cu_9Al_4$, which is likely to corrode through the action of Cl, is reduced, and then the bonding reliability of the ball bonded portion in a high-temperature and high-humidity environment significantly improves.

In view of increasing the bonding longevity of ball bonded portion in a high-temperature and high-humidity environment of a temperature of 130° C. and a relative humidity of 85% to improve the bonding reliability, the concentration of the fourth alloy element group in total relative to the entire bonding wire is 0.1 ppm by mass or more, preferably 0.5 ppm by mass or more, more preferably 1 ppm by mass or more, and further preferably 1.5 ppm by mass or more, 2 ppm by mass or more, 2.5 ppm by mass or more, or 3 ppm by mass or more.

On the other hand, in view of obtaining a favorable FAB shape and consequently favorable ball bendability, the concentration of the fourth alloy element group in the wire in total is 1000 ppm by mass or less, preferably 950 ppm by mass or less, 900 ppm by mass or less, 850 ppm by mass or less, or 800 ppm by mass or less. If a concentration of Sn exceeds 10 ppm by mass or if a concentration of Bi exceeds 1 ppm by mass, an FAB shape becomes faulty. It is therefore preferable for further improving an FAB shape that Sn≤10 ppm by mass; and Bi≤1 ppm by mass. Further, the concentration of Se is more preferable 4.9 ppm by mass or less since the FAB shape and wedge bondability can be further improved.

The bonding wire of the present invention may further contain 0.1 to 200 ppm by mass of one or more elements selected from B, P and La (fifth alloy element group). This is preferable because it is possible to improve a crushed shape of a ball bonded portion required for high-density mounting, that is, improve a circularity of shape of a ball bonded portion.

When the Pd coated Cu bonding wire contains a certain amount of the first+alloy elements group as in the present invention, if Cu is further present at an outermost surface of the bonding wire, the formation of a $Cu_9Al_4$ intermetallic compound in the bonded portion tends to be further reduced. In this case, interaction between the first+alloy elements group and Cu contained in the bonding wire facilitates Pd concentration on a FAB surface during the formation of the FAB, whereby the Pd concentration on a ball bonded interface appears more remarkably. It can be estimated that with this phenomenon an effect of reducing mutual diffusion between Cu and Al by a Pd concentrated layer is further enhanced, a formation amount of $Cu_9Al_4$, which is likely to corrode through the action of Cl, is reduced, and thereby the bonding reliability of ball bonded portion in a high-temperature and high-humidity environment can be further improved. The outermost surface herein refers to a region measured by the Auger electron spectroscopic device on the surface of the bonding wire without sputtering or the like.

When Cu is present at an outermost surface of the Pd skin layer, if the concentration of Cu at the outermost surface is 35 at % or more, the bonding wire may be not suitable for practical use because a sulfur resistance of wire surface degrades and a service life of the bonding wire degrades. Consequently, when Cu is present at an outermost surface of the Pd skin layer, the concentration of Cu at the outermost surface is preferably less than 35 at %. The concentration of Cu at an outermost surface is more preferably less than 30 at %.

As for addition of the first to fifth alloy element groups into the bonding wire, the effect of the invention can be exhibited by employing either of a method of adding these element into a Cu alloy core material or a method of depositing the element onto a Cu alloy core material or a surface of wire to add the element therein. An added amount of these elements is a minute amount and allows a wide variety of methods of addition, and the effect is exhibited by any method of addition so long as the element is contained within the specified concentration range. The content of Pd in the first+alloy elements group is defined in terms of the content in the bonding wire based on the analysis value of the content of Pd in the Cu alloy core material, since it is necessary to distinguish it from the Pd coating layer of the bonding wire. That is, the content of Pd can be calculated by analyzing the content of Pd in the Cu alloy core material and multiplying the analysis value by "(Cu alloy core material mass per wire unit length)/(bonding wire mass per wire unit length)". Pd in the Pd coating layer is not added to the content of Pd.

For a concentration analysis of the Pd coating layer and the alloy skin layer containing Au and Pd, and for a concentration analysis of Pd in the Cu alloy core material, a method of performing analysis while trimming the bonding wire from its surface in the depth direction by sputtering or the like, or a method of exposing a cross-section of the wire and performing a line analysis, a point analysis, or the like thereon is effective. For an analyzer used for such concentration analysis, an Auger electron spectroscopic apparatus installed in a scanning electron microscope or a transmission electron microscope, an energy dispersive X-ray analyzer, and an electron probe micro analyzer, etc., can be applied. As a method for exposing a cross-section of wire, a mechanical polishing, an ion etching, etc., can be applied. For example, when the Cu alloy core material includes a region having a concentration gradient of Pd, the cross section of the bonding wire may be subjected to a line analysis and a point analysis, and a concentration analysis may be performed on a region having no concentration gradient of Pd in the cross section of the Cu alloy core material (for example, the center part of the cross section of the wire (the range of ¼ of the wire diameter)). For a microanalysis of the first to fifth alloy element groups other than Pd in the bonding wire, a solution obtained by dissolving the bonding wire with a strong acid is analyzed using an ICP emission spectrometer or an ICP mass spectrometer, thereby enabling detection as the concentrations of elements contained in the entire bonding wire.

(Method of Manufacture)

Next, there will be described a method for manufacturing the bonding wire according to the embodiment of the present invention. The bonding wire is obtained by manufacturing a Cu alloy used for a core material, working it into a thin wire, forming a Pd coating layer and an Au layer, and performing heat treatment. After forming the Pd coating layer and the Au layer, additional wire drawing and heat treatment may be performed. There will be described in detail a method for manufacturing the Cu alloy core material, a method for forming the Pd coating layer and an alloy skin layer containing Au and Pd, and a method of heat treatment.

The Cu core alloy used for a core material is obtained by melting Cu as a raw material and additive elements together and solidifying them. An arc heating furnace, a high-frequency heating furnace, a resistance heating furnace, or the like can be used for the melting. In order to prevent gases such as $O_2$ and $H_2$ being mixed therein from air, the melting is preferably performed in a vacuum atmosphere or an inert atmosphere such as Ar or $N_2$.

Examples of a method for forming the Pd coating layer and the Au layer on a surface of the Cu alloy core material include a plating method, a vapor deposition method, and a melting method. Both of an electroplating method and an electroless plating method can be used as the plating method. The electroplating called a strike plating or a flash plating is high in plating speed and is favorable in adhesiveness with a substrate. A solution used for the electroless plating is classified into a substitutional type and a reduction type. Although performing the substitutional type plating alone is sufficient for a smaller thickness, it is effective for a larger thickness to perform the reduction type plating after the substitutional type plating in a step-by-step manner.

For a vapor deposition method, there can be used a physical adsorption such as a sputtering method, an ion plating method and a vacuum vapor deposition, and a chemical adsorption such as plasma CVD. They are all dry processes, and are free from the necessity of cleaning after forming the Pd coating layer and the Au layer and from any concern about surface contamination and the like during cleaning.

When heat treatment is performed after forming the Pd coating layer and the Au layer, Pd in the Pd coating layer diffuses into the Au layer to form the alloy skin layer containing Au and Pd. Instead of forming the alloy skin layer containing Au and Pd through the heat treatment after forming the Au layer, the alloy skin layer containing Au and Pd may be deposited from the beginning.

For a formation of the Pd coating layer and the alloy skin layer containing Au and Pd, both a method of forming these layers after performing wire drawing to a final wire diameter and a method of forming these layers on a Cu alloy core material of large diameter and then performing wire drawing several times until obtaining a target wire diameter are effective. In the former in which the Pd coating layer and the alloy skin layer containing Au and Pd are formed at the final wire diameter, manufacture, quality control, and the like are simple. In the latter in which the wire drawing is performed in combination with the formed Pd coating layer and alloy skin layer containing Au and Pd, there is the advantage that adhesiveness with the Cu alloy core material improves. Specific examples of the respective formation methods include a method of forming the Pd coating layer and the alloy skin layer containing Au and Pd on a Cu alloy core material with a final diameter while successively sweeping the wire through an electroplating solution and a method of forming the Pd coating layer and the alloy skin layer containing Au and Pd by immersing a Cu alloy core material of large diameter into an electro or electroless plating solution and then drawing the wire to achieve a final diameter of wire.

After forming the Pd coating layer and the alloy skin layer containing Au and Pd, heat treatment may be performed. By performing the heat treatment, diffusion of atoms occurs among the alloy skin layer containing Au and Pd, the Pd coating layer and the Cu alloy core material, which improves adhesive strength therebetween and is effective in that the alloy skin layer containing Au and Pd and the Pd coating layer are prevented from peeling during working, and thus, improving productivity. In order to prevent $O_2$ being mixed therein from air, it is preferable to perform the heat treatment in a vacuum atmosphere or an inert atmosphere such as Ar or $N_2$.

As described above, when a condition of diffusion heat treatment or annealing heat treatment performed on the bonding wire are adjusted, Cu of the core material diffuses through the Pd coating layer and the alloy skin layer containing Au and Pd enabling Cu to reach an outermost surface of the bonding wire and allows Cu to be present at an outermost surface. For a heat treatment of allowing Cu to be present at an outermost surface, there can be used a heat treatment for forming the alloy skin layer containing Au and Pd as described above. When performing the heat treatment for forming the alloy skin layer, the temperature and time for heat treatment can be selected to allow Cu to be present at an outermost surface, or allow Cu to be not present at an outermost surface. Furthermore, it is also able to adjust a concentration of Cu at an outermost surface to a certain range, e.g., a range of 1 to 50 at %. Alternatively, Cu may be diffused to an outermost surface by heat treatment performed at other than the formation of the alloy skin layer.

As described above, as for addition of the first to fifth alloy element groups into the bonding wire, the effect of the invention can be exhibited by either of the method of adding these elements into the Cu alloy core material or the method of adding these elements therein by depositing these elements onto the Cu alloy core material or the wire surface.

The simplest method for adding the components is a method of adding them to starting materials of the Cu alloy core material. For example, high-purity copper and raw materials of the above component element are weighed as starting raw materials and are then heated and melted in a high vacuum or in an inert atmosphere such as nitrogen and argon to produce an ingot in which the components have been added at the concentration of the intended range, thus obtaining the starting materials containing the component elements at the intended concentrations. Consequently, in a preferable embodiment, the Cu alloy core material of the bonding wire of the present invention contains the elements of the first to fifth alloy element groups so that a concentration of the elements relative to the entire wire will be respective specified concentrations. The preferable numerical range of the concentration in total is as described above.

The above components can also be contained by depositing them on a surface of wire during a manufacturing process of wire. In this case, the deposition may be incorporated into any part of the manufacturing process of wire and may be repeated several times. The deposition may also be incorporated into a plurality of processes. The components may be added to a Cu surface before Pd coating, or may be added to a Pd surface after Pd coating, or may be added to an Au surface after Au coating, or may be incorporated into each coating process. A method of deposition can be selected from application of an aqueous solution, followed by drying and heat treatment, plating (wet), and vapor deposition (dry).

EXAMPLES

The bonding wires according to embodiments of the present invention will be described in detail below with reference to examples.

(Sample)

First, the following describes a method for manufacturing a sample. For Cu as a raw material of a core material, Cu with a purity of 99.99% by mass or more and containing inevitable impurities as the remainder was used. For the first to fifth alloy element groups, the ones with a purity of 99% by mass or more and containing inevitable impurities as the remainder were used. Additive elements to the core material such as the first to fifth alloy element groups are mixed so that the wire or the core material will have a desired composition. Regarding the addition of the first to fifth alloy element groups, they can be mixed singly. Alternatively, they may be mixed so as to be a desired amount using a Cu master alloy containing the additive elements manufactured in advance if the element has a high melting point as a single body or if the element is added in an infinitesimal amount.

The Cu alloy as the core material was manufactured by charging raw materials into a carbon crucible worked into a cylindrical shape with a diameter of 3 to 6 mm, heating and melting the raw materials at 1,090 to 1,300° C. in vacuum or in an inert atmosphere such as an $N_2$ or Ar gas using a high-frequency furnace, and performing furnace cooling. The obtained alloy with a diameter of 3 to 6 mm was drawn to be worked into a diameter of 0.9 to 1.2 mm, and a wire with a diameter of 300 to 600 µm was manufactured by successively performing wire drawing using dies. A commercially available lubricant was used for the wire drawing, and a wire drawing speed was 20 to 150 m/min. In order to remove an oxide film on a surface of wire, pickling treatment with hydrochloric acid was performed, and a Pd coating layer was formed by 1 to 15 µm so as to cover the entire surface of the Cu alloy as the core material. Furthermore, for some wires, an alloy skin layer containing Au and Pd was formed by 0.05 to 1.5 µm on the Pd coating layer. For the formation of the Pd coating layer and the alloy skin layer containing Au and Pd, electroplating was used. A commercially available semiconductor plating solution was used for a plating solution. Heat treatment at 200 to 500° C. and wire drawing were then repeatedly performed to be worked into a diameter of 20 µm. After working, heat treatment was performed while flowing an $N_2$ or Ar gas so that breaking elongation will finally be about 5 to 15%. A method of heat treatment was performed while successively sweeping the wire and was performed while flowing an $N_2$ or Ar gas. A wire feeding speed was 20 to 200 m/min, a heat treatment temperature was 200 to 600° C., and a heat treatment time was 0.2 to 1.0 second.

For the concentration analysis of the Pd coating layer and the alloy skin layer containing Au and Pd, the analysis was performed using an Auger electron spectroscopic apparatus while sputtering the bonding wire from its surface in the depth direction with Ar ions. The thicknesses of the coating layer and the alloy skin layer were determined from an obtained concentration profile (the unit of the depth was in terms of $SiO_2$) in the depth direction. A region in which a concentration of Pd was 50 at % or more and a concentration of Au was less than 10 at % was determined to be the Pd coating layer, and a region in which a concentration of Au was in a range of 10 at % or more on a surface of the Pd coating layer was determined to be the alloy skin layer. The thicknesses and the composition of the coating layer and the alloy skin layer are listed in Tables 1 to 6. The concentration of Pd in the Cu alloy core material was measured by a method that exposes a cross section of the wire and performs line analysis, point analysis, or the like on the center part of the cross section of the wire (the range of ¼ of the wire diameter) by an electron probe micro analyzer installed in a scanning electron microscope. For the method for exposing the cross section of the wire, mechanical polishing, ion etching, or the like was used. The content of Pd in the bonding wire was calculated by multiplying the analysis value of the content of Pd in the analyzed Cu alloy core material by "(Cu alloy core material mass per wire unit length)/(bonding wire mass per wire unit length)". For the concentrations of the first to fifth alloy element groups other than Pd in the bonding wire, a solution obtained by dissolving the bonding wire with a strong acid was analyzed using an ICP emission spectrometer or an ICP mass spectrometer, and they were detected as the concentrations of the elements contained in the entire bonding wire.

(Method of Evaluation)

The bonding reliability of the ball bonded portion in a high-temperature and high humidity environment or a high-temperature environment was determined by manufacturing a sample for bonding reliability evaluation, performing HAST and HTS evaluation, and by evaluating the bonding longevity of the ball bonded portion in each test. The sample for evaluating the bonding reliability was ball bonded onto an electrode, which has been formed by forming an alloy of Al-1.0% Si-0.5% Cu as a film with a thickness of 0.8 μm on a Si substrate on a general metallic frame, using a commercially available wire bonder. A ball was formed while flowing an $N_2$+5% $H_2$ gas at a flow rate of 0.4 to 0.6 L/min, and its size was a diameter of a range from 33 to 34 μm. After bonding the bonding wires, samples were prepared by sealing with two types of epoxy resin with different sulfur contents. As the low concentration of the sulfur-containing resin, a sulfur content of 2 ppm by mass was used, and as the high concentration of the sulfur-containing resin, a sulfur content of 16 ppm by mass was used. For the evaluation of the content of sulfur in the epoxy resin, the resin was crushed and heated in a flow of nitrogen gas at 200° C. for 10 hours, the outgas from the resin contained in the carrier nitrogen gas was collected with hydrogen peroxide water, and the content of sulfur was evaluated by an ion chromatography.

For the HAST evaluation, the sample prepared for evaluating the bonding reliability was exposed to a high-temperature and high-humidity environment with a temperature of 130° C. and a relative humidity of 85% using an unsaturated type pressure cooker tester and was biased with 7 V. A shear test on the ball bonded portion was performed every 48 hours, and a time until a value of shear strength became half of the initial shear strength was determined to be the bonding longevity of the ball bonded portion. The shear test after the high-temperature and high-humidity test was performed after removing the resin by acid treatment and exposing the ball bonded portion.

A tester manufactured by DAGE was used for a shear tester for the HAST evaluation. An average value of measurement values of 10 ball bonded portions randomly selected was used for the value of the shear strength. In the above evaluation, the bonding longevity being less than 96 hours was determined to be practically problematic to be marked with a symbol of "cross," being 96 hours or more and less than 144 hours was determined to be practicable but somewhat problematic to be marked with a symbol of "triangle," being 144 hours or more and less than 288 hours was determined to be practically no problem to be marked with a symbol of "circle," being 288 hours or more and less than 384 hours was determined to be excellent to be marked with a symbol of "double circle," and being 384 hours or more was determined to be particularly excellent to be marked with a symbol of "two double circles," in the column "HAST" in Tables 1 to 6.

For the HTS evaluation, the sample prepared for evaluating the bonding reliability was exposed to a high-temperature environment with a temperature of 200° C. using a high-temperature thermostatic device. A shear test on the ball bonded portion was performed every 500 hours, and a time until a value of shear strength became half of the initial shear strength was determined to be the bonding longevity of the ball bonded portion. The shear test after the high-temperature test was performed after removing the resin by acid treatment and exposing the ball bonded portion.

A tester manufactured by DAGE was used for a shear tester for the HTS evaluation. An average value of measurement values of 10 ball bonded portions randomly selected was used for the value of the shear strength. In the above evaluation, the bonding longevity being less than 250 hours was determined to be practically problematic to be marked with a symbol of "cross," being 250 hours or more and less than 500 hours was determined to be practicable but with request for improvement to be marked with a symbol of "triangle," being 500 hours or more and less than 1000 hours was determined to be practically no problem to be marked with a symbol of "circle," being 1000 hours or more and less than 2000 hours was determined to be excellent to be marked with a symbol of "double circle," and being 2000 hours or more and less than 3000 hours was determined to be particularly excellent to be marked with a symbol of "two double circles," in the column "HTS" in Tables 1 to 6.

For the evaluation of ball formability (FAB shape), a ball before performing bonding was collected and observed, and the presence or absence of voids on the ball surface and the presence or absence of deformation of the ball, which is primarily a perfect sphere, were determined. The occurrence of any of the above was determined to be faulty. The formation of the ball was performed while blowing an $N_2$ gas at a flow rate of 0.5 L/min in order to reduce oxidation in a melting process. The size of the ball was 34 μm. For one condition, 50 balls were observed. An SEM was used for the observation. In the evaluation of the ball formability, a case in which five or more failures occurred was determined to be problematic to be marked with a symbol of "cross," a case of three or four failures was determined to be practicable but somewhat problematic to be marked with a symbol of "triangle," a case of one or two failures was determined to be no problem to be marked with a symbol of "circle," and a case in which no failure occurred was determined to be excellent to be marked with a symbol of "double circle" in the column "FAB shape" in Tables 1 to 6.

The evaluation of wedge bondability on the wire bonded portion was determined by performing 1,000 pieces of bonding on leads of a lead frame and by the occurrence frequency of peeling of the bonded portion. An Fe-42 at % Ni alloy lead frame plated with 1 to 3 μm Ag was used for the lead frame. In this evaluation, assuming bonding conditions more rigorous than normal, a stage temperature was set to 150° C., which was lower than a general set temperature range. In the evaluation, a case in which 11 or more failures occurred was determined to be problematic to be marked with a symbol of "cross," a case of 6 to 10 failures was determined to be practicable but somewhat problematic to be marked with a symbol of "triangle," a case of 1 to 5 failures was determined to be no problem to be marked with a symbol of "circle," and a case in which no failure occurred was determined to be excellent to be marked with a symbol of "double circle" in the column "wedge bondability" in Tables 1 to 6.

The evaluation of a crushed shape of the ball bonded portion was determined by observing the ball bonded portion from immediately above after bonding and evaluating by its circularity. For a bonding counterpart, an electrode in which an Al-0.5% Cu alloy was formed as a film with a thickness of 1.0 μm on a Si substrate was used. The observation was performed using an optical microscope, and 200 sites were observed for one condition. Being elliptic with large deviation from a perfect circle and being anisotropic in deformation were determined to be faulty in the crushed shape of the ball bonded portion. In the above evaluation, a case in which six or more failures occurred was determined to be problematic to be marked with a symbol of "cross," a case of four or five failures was determined to be practicable but somewhat problematic to be marked with a symbol of "triangle," being one to three was determined to be no problem to be marked with a symbol of "circle," and a case in which a favorable perfect circle was obtained for all was determined to be especially excellent to be marked with a symbol of "double circle" in the column "crushed shape" in Tables 1 to 6.

The evaluation of the chip damage was determined by performing ball bonding at 200 points on an electrode in which an Al-0.5% Cu alloy was formed as a film with a thickness of 1.0 μm on a Si substrate, dissolving the wire and the Al electrode with a chemical solution to expose the Si substrate, and observing whether the Si substrate was damaged or not. A case in which two or more damages occurred was determined to be failure to be marked with a symbol of "cross," a case of one damage occurred was determined to be no problem to be marked with a symbol of "circle," and observing no damage was determined to be good to be marked with a symbol of "double circle" in the column "chip damage" in Tables 1 to 6. Symbols of circle and double circle are passing.

TABLE 1-1

Component Content (Pd is in the core material, otherwise in the wire)

| | No. | $M_1$: First Alloy Element Group (% by mass) | | | | $M_1^+$ Total | $M_2$: Second Alloy Element Group (% by mass) | | | | | | | | | | $M_2$ Total | $M_1 +$ Zn |
|---|---|---|---|---|---|---|---|---|---|---|---|---|---|---|---|---|---|---|
| | | Ni | Rh | Ir | Pd | | Li | Sb | Fe | Cr | Co | Zn | Ca | Mg | Pt | Sc | Y | | |
| Inventive Example | 1 | 1.20 | | | | 1.20 | | | 1.3 | | | | | | | | | 1.3 | |
| | 2 | 0.80 | | | | 0.80 | | 1.3 | | | | | | | | | | 1.3 | |
| | 3 | | 1.20 | | | 1.20 | | | | 1.3 | | | | | | | | 1.3 | |
| | 4 | | | 1.20 | | 1.20 | | | | | | 1.3 | | | | | | 1.3 | |
| | 5 | | | | 1.20 | 1.20 | | | | | | | | 1.3 | | | | 1.3 | |
| | 6 | 0.60 | | | | 0.50 | 0.6 | | | | | | | | | | | 0.6 | |
| | 7 | | 0.80 | | | 0.80 | | | | | 1.8 | | | | | | | 1.8 | |
| | 8 | | 0.50 | | | 0.50 | | | | | | 1.9 | | | | | | 1.9 | 2.40 |
| | 9 | | | 0.50 | | 0.50 | | | | | 1.1 | | | | | | | 1.1 | |
| | 10 | | | | 0.50 | 0.50 | 0.4 | | | | | | | | | | | 0.4 | |
| | 11 | 0.30 | | | | 0.30 | | 0.8 | | | | | | | | | | 0.8 | |
| | 12 | | | 0.30 | | 0.30 | | | | | | | | 1.2 | | | | 1.2 | |
| | 13 | 0.05 | | | | 0.05 | 0.002 | | | | | | | | | | | 0.002 | |
| | 14 | 0.08 | | | | 0.08 | 0.002 | | | | | | | | | | | 0.002 | |
| | 15 | | 0.05 | | | 0.05 | 0.002 | | | | | | | | | | | 0.002 | |
| | 16 | | | 0.05 | | 0.05 | | 0.002 | | | | | | | | | | 0.002 | |
| | 17 | | | | 0.05 | 0.05 | | 0.002 | | | | | | | | | | 0.002 | |
| | 18 | 0.10 | 0.60 | | | 0.70 | | | | | | | | | 0.002 | | | 0.002 | |
| | 19 | 0.10 | 0.90 | | | 1.00 | | | 0.002 | | | | | | | | | 0.002 | |
| | 20 | 0.10 | | 0.90 | | 1.00 | | | 0.002 | | | | | | | | | 0.002 | |
| | 21 | 0.10 | | | 0.90 | 1.00 | | | 0.002 | | | | | | | | | 0.002 | |
| | 22 | 1.20 | 0.50 | | | 1.70 | | | | 0.002 | | | | | | | | 0.002 | |
| | 23 | | 1.20 | 0.50 | | 1.70 | | | | 0.002 | | | | | | | | 0.002 | |
| | 24 | | | 1.20 | 0.50 | 1.70 | | | | | | | | 0.011 | | | | 0.011 | |
| | 25 | 0.03 | | | | 0.03 | | | | | 0.002 | | | | | | | 0.002 | |
| | 26 | 0.06 | | | | 0.06 | | | | | 0.002 | | | | | | | 0.002 | |
| | 27 | | 0.03 | | | 0.03 | | | | | 0.002 | | | | | | | 0.002 | |
| | 28 | | | 0.03 | | 0.03 | | | | | | | | 0.011 | | | | 0.011 | |

TABLE 1-3

Component Core (in the wire)

| | No. | Third Alloy Element Group (% by mass) | | | | Third Total | Fourth Alloy Element Group (ppm by mass) | | | | | Fourth Total | Fifth Alloy Element Group (ppm by mass) | | | Fifth Total |
|---|---|---|---|---|---|---|---|---|---|---|---|---|---|---|---|---|
| | | Al | Ga | Ge | In | | As | Te | Sn | Bi | Se | | B | P | La | |
| Inventive Example | 1 | | | | | | | | | | | | | | | |
| | 2 | | | | | | | | | | | | | | | |
| | 3 | | | | | | | | | | | | | | | |
| | 4 | | | | | | | | | | | | | | | |
| | 5 | | | | | | | | | | | | | | | |
| | 6 | | | | | | | | | | | | | | | |
| | 7 | | | | | | | | | | | | | | | |
| | 8 | | | | | | | | | | | | | | | |
| | 9 | | | | | | | | | | | | | | | |
| | 10 | | | | | | | | | | | | | | | |

TABLE 1-3-continued

| | Component Core (in the wire) | | | | | | | | | | | | | | |
|---|---|---|---|---|---|---|---|---|---|---|---|---|---|---|---|
| | Third Alloy Element Group (% by mass) | | | | Third | Fourth Alloy Element Group (ppm by mass) | | | | | Fourth | Fifth Alloy Element Group (ppm by mass) | | | Fifth |
| No. | Al | Ga | Ge | In | Total | As | Te | Sn | Bi | Se | Total | B | P | La | Total |
| 11 | | | | | | | | | | | | | | | |
| 12 | | | | | | | | | | | | | | | |
| 13 | 0.1 | | | | 0.1 | | | | | | | 1 | | | 1 |
| 14 | | 1.1 | | | 1.1 | | | | | | | | | | |
| 15 | | | 0.7 | | 0.7 | | | | | | | | | | |
| 16 | | | | 2.1 | 2.1 | | | | | | | | 50 | | 50 |
| 17 | | 0.2 | | | 0.2 | | | | | | | | | | |
| 18 | 0.05 | | | | 0.05 | | | | | | | | | | |
| 19 | | | | | | | | | | | | | | | |
| 20 | | 0.8 | | | 0.8 | | | | | | | | | 100 | 100 |
| 21 | | | 0.05 | | 0.05 | | | | | | | | | | |
| 22 | | | | 0.03 | 0.03 | | | | | | | | | | |
| 23 | 1.1 | | | | 1.1 | | | | | | | | | | |
| 24 | 0.2 | | | | 0.2 | | | | | | | | | | |
| 25 | | 1.2 | | | 1.2 | | | | | | | | | | |
| 26 | | | 0.05 | | 0.05 | | | | | | | | | | |
| 27 | | | | 0.08 | 0.08 | | | | | | | | | | |
| 28 | | | 0.3 | | 0.3 | | | | | | | | | | |

TABLE 2-1

| | | Wire Properties | | Quality Evaluation Results | | | | | | |
|---|---|---|---|---|---|---|---|---|---|---|
| | | Film Thickness of the Pd Coating Layer (μm) | Film Thickness of the Alloy Skin Layer Containing Au and Pd (μm) | HAST | HTS Low Concentration Sulfur-Containing Resin | HTS High Concentration Sulfur-Containing Resin | FAB Shape | Wedge Bondability | Crushed Shape | Chip Damage |
| | No. | | | | | | | | | |
| Inventive Example | 1 | 0.150 | 0.01 | ○ | ⊚ | ⊚ | △ | ⊚ | ○ | ⊚ |
| | 2 | 0.100 | 0.001 | ○ | ⊚ | ⊚ | △ | ⊚ | ○ | ⊚ |
| | 3 | 0.015 | 0.003 | △ | ⊚ | ⊚ | △ | ⊚ | ○ | ⊚ |
| | 4 | 0.015 | 0.08 | △ | ⊚ | ⊚ | △ | ⊚ | ○ | ⊚ |
| | 5 | 0.150 | 0.01 | ○ | ⊚ | ⊚ | △ | ⊚ | ○ | ⊚ |
| | 6 | 0.015 | 0.001 | △ | ⊚ | ⊚ | △ | ⊚ | ○ | ⊚ |
| | 7 | 0.150 | 0.001 | ○ | ⊚ | ⊚ | △ | ⊚ | ○ | ○ |
| | 8 | 0.100 | 0.0005 | ○ | ⊚ | ⊚ | △ | ○ | ○ | ⊚ |
| | 9 | 0.015 | 0.01 | △ | ⊚ | ⊚ | △ | ⊚ | ○ | ⊚ |
| | 10 | 0.015 | 0.01 | △ | ⊚ | ⊚ | △ | ⊚ | ○ | ⊚ |
| | 11 | 0.015 | 0.08 | △ | ⊚ | ⊚ | △ | ⊚ | ○ | ⊚ |
| | 12 | 0.060 | 0.001 | ○ | ⊚ | ⊚ | △ | ⊚ | ○ | ⊚ |
| | 13 | 0.060 | 0.01 | ⊚ | ○ | ○ | ⊚ | ⊚ | ⊚ | ⊚ |
| | 14 | 0.015 | 0.01 | ○ | ○ | ○ | ⊚ | ⊚ | ○ | ⊚ |
| | 15 | 0.150 | 0.003 | ⊚ | ○ | ○ | ○ | ⊚ | ○ | ⊚ |
| | 16 | 0.050 | 0.01 | ⊚ | ○ | ○ | ⊚ | ⊚ | ⊚ | ⊚ |
| | 17 | 0.015 | 0.001 | ○ | ○ | ○ | ⊚ | ⊚ | ○ | ⊚ |
| | 18 | 0.015 | 0.08 | ○ | ○ | ○ | ⊚ | ⊚ | ○ | ⊚ |
| | 19 | 0.100 | 0.0005 | ○ | ○ | ○ | ⊚ | ○ | ○ | ⊚ |
| | 20 | 0.050 | 0.0005 | ⊚ | ⊚ | ○ | ⊚ | ⊚ | ⊚ | ⊚ |
| | 21 | 0.100 | 0.01 | ○ | ○ | ○ | ⊚ | ⊚ | ○ | ○ |
| | 22 | 0.160 | 0.01 | ○ | ○ | ○ | ○ | ⊚ | ○ | ○ |
| | 23 | 0.100 | 0.01 | ⊚ | ⊚ | ○ | ⊚ | ⊚ | ○ | ○ |
| | 24 | 0.100 | 0.01 | ⊚ | ⊚ | ○ | ⊚ | ⊚ | ○ | ○ |
| | 25 | 0.150 | 0.08 | ⊚ | ○ | ○ | ○ | ⊚ | ○ | ⊚ |
| | 26 | 0.160 | 0.06 | ○ | ○ | ○ | ○ | ⊚ | ○ | ⊚ |
| | 27 | 0.015 | 0.08 | ○ | ○ | ○ | ⊚ | ⊚ | ○ | ⊚ |
| | 28 | 0.150 | 0.001 | ⊚ | ○ | ○ | ○ | ○ | ○ | ⊚ |

TABLE 2-1

Component Content (Pd is in the core material, otherwise in the wire)

| | No. | M₁: First Alloy Element Group (% by mass) | | | | M₁⁺ Total | M₂: Second Alloy Element Group (% by mass) | | | | | | | | | | | M₂ Total | M₁ + Zn |
|---|---|---|---|---|---|---|---|---|---|---|---|---|---|---|---|---|---|---|---|
| | | Ni | Rh | Ir | Pd | | Li | Sb | Fe | Cr | Co | Zn | Ca | Mg | Pt | Sc | Y | | |
| Inventive Example | 29 | 1.10 | 0.20 | 0.30 | | 1.60 | 0.015 | | | | | | | | | | | 0.015 | |
| | 30 | | 1.10 | 0.20 | 0.30 | 1.60 | 0.05 | | | | | | | | | | | 0.05 | |
| | 31 | 0.60 | | | | 0.60 | 1.8 | | | | | | | | | | | 1.8 | |
| | 32 | 0.80 | | | | 0.80 | | 0.015 | | | | | | | | | | 0.015 | |
| | 33 | | 0.60 | | | 0.60 | | 0.05 | | | | | | | | | | 0.05 | |
| | 34 | | | 0.60 | | 0.60 | | 1.8 | | | | | | | | | | 1.8 | |
| | 35 | | | | 0.60 | 0.60 | | | 0.015 | | | | | | | | | 0.015 | |
| | 36 | 0.05 | | 1.10 | | 1.15 | | | 0.05 | | | | | | | | | 0.05 | |
| | 37 | | 1.10 | 0.05 | | 1.15 | | | 1.8 | | | | | | | | | 1.8 | |
| | 38 | | 0.05 | 1.10 | | 1.15 | | | | 0.015 | | | | | | | | 0.015 | |
| | 39 | | | 0.05 | 1.10 | 1.15 | | | | 0.06 | | | | | | | | 0.06 | |
| | 40 | 1.10 | | | | 1.10 | | | | 1.8 | | | | | | | | 1.8 | |
| | 41 | | | 0.70 | | 0.70 | | | | | 0.015 | | | | | | | 0.015 | |
| | 42 | | | | 1.20 | 1.20 | | | | | 0.05 | | | | | | | 0.05 | |
| | 43 | 0.80 | | | | 0.80 | | | | | 1.8 | | | | | | | 1.8 | |
| | 44 | 0.80 | | | | 0.80 | | | | | | 1.4 | | | | | | 1.4 | 2.2 |
| | 45 | 0.80 | | | | 0.80 | | | | | | 1.8 | | | | | | 1.8 | 2.6 |
| | 46 | 0.80 | | | | 0.80 | | | | | | 2.8 | | | | | | 2.8 | 3.6 |
| | 47 | 0.80 | | | | 0.80 | | | | | | | 0.015 | | | | | 0.015 | |
| | 48 | 0.80 | | | | 0.80 | | | | | | | 0.05 | | | | | 0.05 | |
| | 49 | 0.80 | | | | 0.80 | | | | | | | 1.8 | | | | | 1.8 | |
| | 50 | 0.80 | | | | 0.80 | | | | | | | | 0.015 | | | | 0.015 | |
| | 51 | 0.80 | | | | 0.80 | | | | | | | | 0.05 | | | | 0.05 | |
| | 52 | 0.80 | | | | 0.80 | | | | | | | | 1.8 | | | | 1.8 | |
| | 53 | 1.50 | | | | 1.50 | | | | | | | | | 0.7 | | | 0.7 | 2.2 |
| | 54 | 1.90 | | | | 1.90 | | | | | | | | | 1.2 | | | 1.2 | 3.1 |
| | 55 | | 0.80 | | | 0.80 | | | | | | | | | | 0.8 | | 0.8 | |
| | 56 | | 0.80 | | | 0.80 | | | | | | | | | | | 1.2 | 1.2 | |

TABLE 2-2

Component Core (in the wire)

| | No. | Third Alloy Element Group (% by mass) | | | | Third Total | Fourth Alloy Element Group (ppm by mass) | | | | | Fourth Total | Fifth Alloy Element Group (ppm by mass) | | | Fifth Total |
|---|---|---|---|---|---|---|---|---|---|---|---|---|---|---|---|---|
| | | Al | Ga | Ge | In | | As | Te | Sn | Bi | Se | | B | P | La | |
| Inventive Example | 29 | 0.05 | | | | 0.05 | 0.3 | | | | | 0.3 | | | | |
| | 30 | | | 0.5 | | 0.5 | 1.1 | | | | | 1.1 | 1 | | | 1 |
| | 31 | 1.1 | | | | 1.1 | 21 | | | | | 21 | | 50 | | 50 |
| | 32 | | 0.5 | | | 0.5 | 68 | | | | | 68 | | | 100 | 100 |
| | 33 | | | | 1.3 | 1.3 | 600 | | | | | 600 | | | | |
| | 34 | | 0.2 | | | 0.2 | | 0.5 | | | | 0.5 | | | | |
| | 35 | 1.1 | | | | 1.1 | | 92 | | | | 92 | | | | |
| | 36 | | | | | | | 223 | | | | 223 | | | | |
| | 37 | | | | | | | 555 | | | | 555 | | | | |
| | 38 | | | | | | | | 0.15 | | | 0.15 | | | | |
| | 39 | | | | | | | | 0.2 | | | 0.2 | | | | |
| | 40 | | | | | | | | 0.8 | | | 0.8 | | | | |
| | 41 | | | | | | | | 10 | | | 10 | | | | |
| | 42 | | | | | | | | | 0.15 | | 0.15 | | | | |
| | 43 | | | | | | | | | 0.15 | 5 | 5.15 | 50 | | | 50 |
| | 44 | | | | | | | | | 0.8 | | 0.8 | | | | |
| | 45 | | | | | | | | | 1 | | 1 | 100 | | | 100 |
| | 46 | | | | | | | | | | 0.5 | 0.5 | 50 | | | 50 |
| | 47 | | | | | | | | | | 1.2 | 1.2 | | | | |
| | 48 | | | | | | | | | | 3 | 3 | | 1 | | 1 |
| | 49 | | | | | | | | | | 4.5 | 4.5 | | | | |
| | 50 | | | | | | | | 35 | 65 | | 100 | 100 | | | 100 |
| | 51 | | | | | | | | 587 | 80 | | 667 | | | | |

TABLE 2-2-continued

| | | Component Core (in the wire) | | | | | | | | | | | | |
|---|---|---|---|---|---|---|---|---|---|---|---|---|---|---|
| | Third Alloy Element Group (% by mass) | | | | Third | Fourth Alloy Element Group (ppm by mass) | | | | Fourth | Fifth Alloy Element Group (ppm by mass) | | | Fifth |
| No. | Al | Ga | Ge | In | Total | As | Te | Sn | Bi | Se | Total | B | P | La | Total |
| 52 | | | | | | | 87 | 0.2 | | | 87.2 | | | 100 | 100 |
| 53 | | | | | | | 90 | 0.6 | | | 90.6 | | | | |
| 54 | | | | | | | | 1 | 0.9 | | 1.9 | | | 1 | 1 |
| 55 | | | 0.9 | | 0.9 | | | | | | | | | | |
| 56 | 0.5 | | | | 0.5 | | | | | | | | | 50 | 50 |

TABLE 2-3

| | | Wire Properties | | Quality Evaluation Results | | | | | | |
|---|---|---|---|---|---|---|---|---|---|---|
| | | Film Thickness of the Pd Coating Layer (μm) | Film Thickness of the Alloy Skin Layer Containing Au and Pd (μm) | HAST | HTS Low Concentration Sulfur-Containing Resin | HTS High Concentration Sulfur-Containing Resin | FAB Shape | Wedge Bond-ability | Crushed Shape | Chip Damage |
| | No. | | | | | | | | | |
| Inventive Example | 29 | 0.050 | 0.01 | ◎ | ◎ | ○ | ◎ | ◎ | ○ | ◎ |
| | 30 | 0.100 | 0.003 | ◎◎ | ◎ | ◎ | ◎ | ◎ | ◎ | ◎ |
| | 31 | 0.015 | 0.001 | ◎◎ | ◎ | ◎ | ◎ | ◎ | ◎ | ○ |
| | 32 | 0.060 | 0.001 | ◎◎ | ◎ | ○ | ◎ | ◎ | ◎ | ◎ |
| | 33 | 0.015 | 0.01 | ◎ | ◎ | ◎ | ◎ | ◎ | ○ | ◎ |
| | 34 | 0.100 | 0.0005 | ◎ | ◎ | ◎ | ◎ | ○ | ○ | ○ |
| | 35 | 0.050 | 0.003 | ◎◎ | ◎ | ○ | ◎ | ◎ | ○ | ◎ |
| | 36 | 0.100 | 0.08 | ◎ | ◎ | ◎ | ◎ | ◎ | ○ | ◎ |
| | 37 | 0.150 | 0.01 | ◎ | ◎ | ◎ | ○ | ◎ | ○ | ○ |
| | 38 | 0.015 | 0.05 | ○ | ◎ | ○ | ◎ | ◎ | ○ | ◎ |
| | 39 | 0.050 | 0.003 | ○ | ◎ | ◎ | ◎ | ◎ | ○ | ◎ |
| | 40 | 0.050 | 0.01 | ◎ | ◎ | ◎ | ◎ | ◎ | ○ | ○ |
| | 41 | 0.150 | 0.08 | ◎ | ◎ | ○ | ○ | ◎ | ○ | ◎ |
| | 42 | 0.050 | 0.05 | ○ | ◎ | ◎ | ◎ | ◎ | ○ | ◎ |
| | 43 | 0.050 | 0.06 | ◎ | ◎ | ◎ | △ | △ | ◎ | ○ |
| | 44 | 0.100 | 0.01 | ◎ | ◎ | ○ | ◎ | ◎ | ○ | ◎ |
| | 45 | 0.050 | 0.01 | ◎ | ◎ | ◎ | ◎ | ◎ | ◎ | ◎ |
| | 46 | 0.100 | 0.003 | ◎ | ◎ | ◎◎ | ◎ | ◎ | ◎ | ◎ |
| | 47 | 0.015 | 0.08 | ○ | ◎ | ○ | ◎ | ◎ | ○ | ◎ |
| | 48 | 0.150 | 0.01 | ◎ | ◎ | ◎ | ○ | ◎ | ◎ | ◎ |
| | 49 | 0.050 | 0.001 | ◎ | ◎ | ◎ | ◎ | ◎ | ○ | ○ |
| | 50 | 0.060 | 0.08 | ◎ | ◎ | ○ | ◎ | ◎ | ◎ | ◎ |
| | 51 | 0.050 | — | ◎ | ◎ | ◎ | ◎ | △ | ○ | ◎ |
| | 52 | 0.015 | 0.003 | ○ | ◎ | ◎ | ◎ | ◎ | ◎ | ◎ |
| | 53 | 0.150 | 0.003 | ◎ | ◎ | ○ | ○ | ◎ | ○ | ◎ |
| | 54 | 0.150 | 0.08 | ◎ | ◎ | ◎◎ | ○ | ◎ | ◎ | ○ |
| | 55 | 0.100 | 0.001 | ◎ | ◎ | ◎ | ◎ | ◎ | ○ | ◎ |
| | 56 | 0.050 | 0.01 | ◎ | ◎ | ◎ | ◎ | ◎ | ◎ | ◎ |

TABLE 3-1

| | | M₁⁺: First + Alloy Elements Group (% by mass) | | | | | | | | | | | | | | | | | |
|---|---|---|---|---|---|---|---|---|---|---|---|---|---|---|---|---|---|---|---|
| | | M₁: First Alloy Element Group (% by mass) | | | | | M₁* | M₂: Second Alloy Element Group (% by mass) | | | | | | | | | | M₂ | M₁+ |
| | No. | Ni | Rh | Ir | Pd | Total | | Li | Sb | Fe | Cr | Co | Zn | Ca | Mg | Pt | Sc | Y | Total | Zn |
| Inventive Example | 57 | 0.80 | | | | 0.80 | | 0.8 | | | | | | | | | | | 0.8 | |
| | 58 | 0.80 | | | | 0.80 | | | | | | | | | | 1.2 | | | 1.2 | |
| | 59 | 0.80 | | | | 0.80 | | | 0.8 | | | | | | | | | | 0.8 | |
| | 60 | 0.80 | | | | 0.80 | | | 1.2 | | | | | | | | | | 1.2 | |
| | 61 | 0.80 | | | | 0.80 | | | | 0.8 | | | | | | | | | 0.8 | |
| | 62 | 0.80 | | | | 0.80 | | | | 1.2 | | | | | | | | | 1.2 | |
| | 63 | 0.80 | | | | 0.80 | | | | | 0.8 | | | | | | | | 0.8 | |
| | 64 | 0.80 | | | | 0.80 | | | | | 1.2 | | | | | | | | 1.2 | |
| | 65 | 0.80 | | | | 0.80 | | | | | | | | | | 0.8 | | | 0.8 | |
| | 66 | 0.80 | | | | 0.80 | | | | | | | | | 1.2 | | | | 1.2 | |
| | 67 | 0.80 | | | | 0.80 | 1.3 | | | | | | | | | | | | 1.3 | |
| | 68 | 0.80 | | | | 0.80 | | 1.3 | | | | | | | | | | | 1.3 | |
| | 69 | 0.80 | | | | 0.80 | | | 1.3 | | | | | | | | | | 1.3 | |
| | 70 | 0.80 | | | | 0.80 | | | | | 1.3 | | | | | | | | 1.3 | |
| | 71 | | 0.80 | | | 0.80 | | | | | 1.3 | | | | | | | | 1.3 | |
| | 72 | | 0.80 | | | 0.80 | | | | | | | 1.3 | | | | | | 1.3 | |
| | 73 | | 0.80 | | | 0.80 | | | | | | | | | | 1.3 | | | 1.3 | |
| | 74 | | 0.80 | | | 0.80 | 0.6 | | | | | | | | | | | | 0.6 | |
| | 75 | | 0.80 | | | 0.80 | | | | | | 1.8 | | | | | | | 1.8 | |
| | 76 | | 0.80 | | | 0.80 | | | | | | | | | | 1.5 | | | 1.5 | |
| | 77 | | 0.80 | | | 0.80 | | | | | 1.1 | | | | | | | | 1.1 | |
| | 78 | | 0.80 | | | 0.80 | | 0.4 | | | | | | | | | | | 0.4 | |
| | 79 | | 0.80 | | | 0.80 | | | 0.8 | | | | | | | | | | 0.8 | |
| | 80 | | 0.80 | | | 0.80 | | | | | | | | | 1.2 | | | | 1.2 | |
| | 81 | | 0.80 | | | 0.80 | | | | 0.8 | | | | | | | | | 0.8 | |
| | 82 | | 0.80 | | | 0.80 | | | | | | | 2.4 | | | | | | 2.4 | 3.2 |
| | 83 | | 0.80 | | | 0.80 | | | | | | | | | | 1.8 | | | 1.8 | |
| | 84 | | 0.80 | | | 0.80 | | | | 0.8 | | | | | | | | | 0.8 | |
| | 85 | | 0.80 | | | 0.80 | | | | | 0.02 | | | | | | | | 0.02 | |

TABLE 3-2

| | | Component Core (in the wire) | | | | | | | | | | | | | | |
|---|---|---|---|---|---|---|---|---|---|---|---|---|---|---|---|---|
| | | Third Alloy Element Group (% by mass) | | | | Third | Fourth Alloy Element Group (ppm by mass) | | | | | Fourth | Fifth Alloy Element Group (ppm by mass) | | | Fifth |
| | No. | Al | Ga | Ge | In | Total | As | Te | Sn | Bi | Se | Total | B | P | La | Total |
| Inventive Example | 57 | | | | 0.05 | 0.05 | | | | | | | 50 | | | 50 |
| | 58 | | 0.3 | | | 0.3 | | | | | | | | 100 | | 100 |
| | 59 | 0.1 | | | | 0.1 | | | | | | | | | 1 | 1 |
| | 60 | | | 0.2 | | 0.2 | | | | | | | 50 | | | 50 |
| | 61 | 0.8 | | | | 0.8 | | | | | | | | 100 | | 100 |
| | 62 | | | 1.2 | | 1.2 | | | | | | | | | 1 | 1 |
| | 63 | | | | 2 | 2 | | | | | | | 50 | | | 50 |
| | 64 | | | 0.1 | | 0.1 | | | | | | | | 100 | | 100 |
| | 65 | 0.3 | | | | 0.3 | | | | | | | | | 1 | 1 |
| | 66 | | | | | | 0.4 | | | | | 0.4 | | | | |
| | 67 | | | | | | 1.2 | | | | | 1.2 | | | | |
| | 68 | | | | | | 12 | | | | | 12 | 1 | | | 1 |
| | 69 | | | | | | 75 | | | | | 75 | | 50 | | 50 |
| | 70 | | | | | | | 0.2 | | | | 0.2 | | | 1 | 1 |
| | 71 | | | | | | | 1.3 | | | | 1.3 | 50 | | | 50 |
| | 72 | | | | | | | 10 | | | | 10 | | 100 | | 100 |
| | 73 | | | | | | | | 0.1 | | | 0.1 | | | 1 | 1 |
| | 74 | | | | | | | | 1.2 | | | 1.2 | | | | |
| | 75 | | | | | | | | 9.9 | | | 9.9 | | | | |
| | 76 | | | | | | | | | 0.1 | | 0.1 | | | | |
| | 77 | | | | | | | | | 1.2 | | 1.2 | | | | |
| | 78 | | | | | | | | | 4.9 | | 4.9 | | | | |

TABLE 3-2-continued

| | Third Alloy Element Group (% by mass) | | | | Third | Fourth Alloy Element Group (ppm by mass) | | | | | Fourth | Fifth Alloy Element Group (ppm by mass) | | | Fifth |
|---|---|---|---|---|---|---|---|---|---|---|---|---|---|---|---|
| No. | Al | Ga | Ge | In | Total | As | Te | Sn | Bi | Se | Total | B | P | La | Total |
| 79 | | | 0.9 | | 0.9 | | | | 99 | | 99 | 50 | | | 50 |
| 80 | 0.5 | | | | 0.5 | | | | | 0.5 | 0.5 | | 100 | | 100 |
| 81 | | | | 0.03 | 0.03 | | | | | 3.2 | 3.2 | | | 1 | 1 |
| 82 | | 1 | | | 1 | | | | | 8.9 | 8.9 | | | | |
| 83 | 0.3 | | | | 0.3 | | | | | 76 | 76 | | | | |
| 84 | | | 0.1 | | 0.1 | 8.6 | | | | | 8.6 | | | | |
| 85 | 0.8 | | | | 0.8 | | | 8.5 | | | 8.5 | | | | |

TABLE 3-3

| | | Wire Properties | | Quality Evaluation Results | | | | | | |
|---|---|---|---|---|---|---|---|---|---|---|
| | | Film Thickness of the Pd Coating Layer (μm) | Film Thickness of the Alloy Skin Layer Containing Au and Pd (μm) | | HTS | | | | | |
| | No. | | | HAST | Low Concentration Sulfur-Containing Resin | High Concentration Sulfur-Containing Resin | FAB Shape | Wedge Bondability | Crushed Shape | Chip Damage |
| Inventive Example | 57 | 0.100 | 0.01 | ◎ | ◎ | ◎ | ◎ | ◎ | ◎ | ◎ |
| | 58 | 0.015 | 0.08 | ○ | ◎ | ◎ | ◎ | ◎ | ◎ | ◎ |
| | 59 | 0.015 | 0.01 | ○ | ◎ | ◎ | ◎ | ◎ | ◎ | ◎ |
| | 60 | 0.050 | 0.01 | ◎ | ◎ | ◎ | ◎ | ◎ | ◎ | ◎ |
| | 61 | 0.150 | 0.001 | ◎ | ◎ | ◎ | ○ | ◎ | ◎ | ◎ |
| | 62 | 0.100 | 0.003 | ◎ | ◎ | ◎ | ○ | ◎ | ◎ | ◎ |
| | 63 | 0.100 | 0.001 | ◎ | ◎ | ◎ | ◎ | ○ | ◎ | ◎ |
| | 64 | 0.100 | 0.001 | ◎ | ◎ | ◎ | ◎ | ◎ | ◎ | ◎ |
| | 65 | 0.100 | 0.01 | ◎ | ◎ | ◎ | ◎ | ◎ | ◎ | ◎ |
| | 66 | 0.050 | 0.0005 | ○ | ◎ | ◎ | ◎ | ○ | ○ | ◎ |
| | 67 | 0.150 | 0.05 | ◎ | ◎ | ◎ | ○ | ◎ | ○ | ◎ |
| | 68 | 0.015 | 0.08 | ○ | ◎ | ◎ | ◎ | ◎ | ◎ | ◎ |
| | 69 | 0.150 | 0.01 | ◎ | ◎ | ◎ | ○ | ◎ | ◎ | ◎ |
| | 70 | 0.100 | 0.001 | ○ | ◎ | ◎ | ◎ | ◎ | ◎ | ◎ |
| | 71 | 0.015 | 0.003 | ○ | ◎ | ◎ | ◎ | ◎ | ◎ | ◎ |
| | 72 | 0.015 | 0.08 | ○ | ◎ | ◎ | ◎ | ◎ | ◎ | ◎ |
| | 73 | 0.150 | 0.01 | ○ | ◎ | ◎ | ○ | ◎ | ◎ | ◎ |
| | 74 | 0.015 | 0.001 | ○ | ◎ | ◎ | ◎ | ◎ | ○ | ◎ |
| | 75 | 0.150 | 0.001 | ◎ | ◎ | ◎ | ○ | ◎ | ○ | ○ |
| | 76 | 0.100 | 0.0005 | ○ | ◎ | ◎ | ◎ | ○ | ○ | ◎ |
| | 77 | 0.015 | 0.01 | ○ | ◎ | ◎ | △ | ◎ | ○ | ◎ |
| | 78 | 0.015 | 0.01 | ○ | ◎ | ◎ | △ | ◎ | ○ | ◎ |
| | 79 | 0.015 | 0.08 | ◎ | ◎ | ◎ | △ | ◎ | ◎ | ◎ |
| | 80 | 0.050 | 0.001 | ◎◎ | ◎ | ◎ | ◎ | ◎ | ◎ | ◎ |
| | 81 | 0.015 | 0.001 | ○ | ◎ | ◎ | ◎ | ◎ | ◎ | ◎ |
| | 82 | 0.015 | 0.0005 | ◎◎ | ◎ | ◎ | △ | △ | ○ | ◎ |
| | 83 | 0.150 | 0.05 | ◎◎ | ◎ | ◎ | △ | △ | ○ | ○ |
| | 84 | 0.100 | 0.05 | ◎◎ | ◎ | ◎ | ◎ | ◎ | ○ | ◎ |
| | 85 | 0.150 | 0.001 | ◎◎ | ◎ | ○ | △ | ◎ | ○ | ◎ |

TABLE 4-1

Component Content (Pd is in the core material, otherwise in the wire)

| | | $M_1^+$: First$^+$ Alloy Elements Group (% by mass) | | | | | | | | | | | | | | | | | |
| | | $M_1$: First Alloy Element Group (% by mass) | | | | | $M_1^+$ | $M_2$: Second Alloy Element Group (% by mass) | | | | | | | | | | $M_2$ | $M_1+$ |
| | No. | Ni | Rh | Ir | Pd | Total | Li | Sb | Fe | Cr | Co | Zn | Ca | Mg | Pt | Sc | Y | Total | Zn |
|---|---|---|---|---|---|---|---|---|---|---|---|---|---|---|---|---|---|---|---|
| Inventive Example | 86 | | | 0.80 | | 0.80 | | | | | | | 0.08 | | | | | 0.08 | |
| | 87 | | 0.80 | | | 0.80 | | 0.5 | | | | | | | | | | 0.5 | |
| | 88 | | | 0.80 | | 0.80 | | | 1.6 | | | | | | | | | 1.6 | |
| | 89 | | | 0.80 | | 0.80 | | | | 0.3 | | | | | | | | 0.3 | |
| | 90 | | | 0.80 | | 0.80 | 1.8 | | | | | | | | | | | 1.8 | |
| | 91 | | | 0.80 | | 0.80 | | | | | | 0.5 | 1.6 | | | | | 2.1 | |
| | 92 | | | 0.80 | | 0.80 | | | | | | 0.5 | 1.6 | | | | | 2.1 | |
| | 93 | | | 0.80 | | 0.80 | | | | | | 0.5 | 1.6 | | | | | 2.1 | |
| | 94 | | | 0.80 | | 0.80 | | | | | | 0.5 | 1.6 | | | | | 2.1 | |
| | 95 | | | 0.80 | | 0.80 | | | | | | 0.5 | 1.6 | | | | | 2.1 | |
| | 96 | | | 0.80 | | 0.80 | | | | | | 0.5 | 1.6 | | | | | 2.1 | |
| | 97 | | | 0.80 | | 0.80 | | | | | | 0.5 | 1.6 | | | | | 2.1 | |
| | 98 | | | 0.80 | | 0.80 | | | | | | 0.5 | 1.6 | | | | | 2.1 | |
| | 99 | | | 0.80 | | 0.80 | | | | | | 0.5 | 1.6 | | | | | 2.1 | |
| | 100 | | | 0.80 | | 0.80 | | | | | | 0.5 | 1.6 | | | | | 2.1 | |
| | 101 | | | 0.80 | | 0.80 | | | | | | 0.5 | 1.6 | | | | | 2.1 | |
| | 102 | | | 0.80 | | 0.80 | | | | | | 0.5 | 1.6 | | | | | 2.1 | |
| | 103 | 1.20 | 0.50 | | | 1.70 | | | | 0.3 | | | | | 0.3 | | | 0.6 | |
| | 104 | 1.20 | 0.50 | | | 1.70 | | | | 0.3 | | | | | 0.3 | | | 0.6 | |
| | 105 | 1.20 | 0.50 | | | 1.70 | | | | 0.3 | | | | | 0.3 | | | 0.6 | |
| | 106 | 1.20 | 0.50 | | | 1.70 | | | | 0.3 | | | | | 0.3 | | | 0.6 | |
| | 107 | 1.20 | 0.50 | | | 1.70 | | | | 0.3 | | | | | 0.3 | | | 0.6 | |
| | 108 | 1.20 | 0.50 | | | 1.70 | | | | 0.3 | | | | | 0.3 | | | 0.6 | |
| | 109 | 1.20 | 0.50 | | | 1.70 | | | | 0.3 | | | | | 0.3 | | | 0.6 | |
| | 110 | 1.20 | 0.50 | | | 1.70 | | | | 0.3 | | | | | 0.3 | | | 0.6 | |
| | 111 | 1.20 | 0.50 | | | 1.70 | | | | 0.3 | | | | | 0.3 | | | 0.6 | |
| | 112 | 1.20 | 0.50 | | | 1.70 | | | | 0.3 | | | | | 0.3 | | | 0.6 | |
| | 113 | 1.20 | 0.50 | | | 1.70 | | | | 0.3 | | | | | 0.3 | | | 0.6 | |
| | 114 | 1.20 | 0.50 | | | 1.70 | | | | 0.3 | | | | | 0.3 | | | 0.6 | |

TABLE 4-2

Component Core (in the wire)

| | | Third Alloy Element Group (% by mass) | | | | | Fourth Alloy Element Group (ppm by mass) | | | | | | Fifth Alloy Element Group (ppm by mass) | | | |
| | No. | Al | Ga | Ge | In | Total | As | Te | Sn | Bi | Se | Total | B | P | La | Total |
|---|---|---|---|---|---|---|---|---|---|---|---|---|---|---|---|---|
| Inventive Example | 86 | | | 0.03 | | 0.03 | | 2.3 | | | | 2.3 | | | | |
| | 87 | | | | 0.5 | 0.5 | | | 2.5 | | | 2.5 | | | | |
| | 88 | | 1 | | | 1 | | | | | 3.6 | 3.6 | 50 | | | |
| | 89 | 1.5 | | | | 1.5 | | | | 7.5 | | 7.5 | | 100 | | 100 |
| | 90 | | 0.2 | | | 0.2 | | 6.8 | | | | 6.8 | | | 1 | 1 |
| | 91 | | | | | | 5 | | | | | 5 | | | | |
| | 92 | | | | | | 18 | | | | | 18 | | | | |
| | 93 | | | | | | 123 | | | | | 123 | | | | |
| | 94 | | | | | | 254 | | | | | 254 | | | | |
| | 95 | | | | | | 612 | | | | | 612 | | | | |
| | 96 | | | | | | | 87 | | | | 87 | | | | |
| | 97 | | | | | | | 158 | | | | 158 | | | | |
| | 98 | | | | | | | 356 | | | | 356 | | | | |
| | 99 | | | | | | | 888 | | | | 888 | | | | |
| | 100 | | | | | | | | 0.3 | | | 0.3 | | | | |
| | 101 | | | | | | | | 1 | | | 1 | | | | |
| | 102 | | | | | | | | 5 | | | 5 | | | | |
| | 103 | 0.2 | 1 | | | 1.2 | | | 8 | | | 8 | | | | |
| | 104 | | 0.2 | 1 | | 1.2 | | | | 0.15 | | 0.15 | | | | |
| | 105 | | | 0.2 | 1 | 1.2 | | | | 0.8 | | 0.8 | | | | |
| | 106 | | | | 1 | 1 | | | | 0.9 | | 0.9 | | | | |
| | 107 | 1 | | | | 1 | | | | 0.9 | 0.8 | 1.7 | | | | |

TABLE 4-2-continued

| | Component Core (in the wire) | | | | | | | | | | | | | |
|---|---|---|---|---|---|---|---|---|---|---|---|---|---|---|
| | Third Alloy Element Group (% by mass) | | | | Third | Fourth Alloy Element Group (ppm by mass) | | | | Fourth | Fifth Alloy Element Group (ppm by mass) | | | Fifth |
| No. | Al | Ga | Ge | In | Total | As | Te | Sn | Bi | Se | Total | B | P | La | Total |
| 108 | | | | | | | | | | 4.2 | 4.2 | | | | |
| 109 | | | | | | | | | | 55 | 55 | | | | |
| 110 | | | | | | | | | | 89 | 89 | | | | |
| 111 | | | | | | | | | | 100 | 100 | | | | |
| 112 | | | | | | 5 | 20 | | | 4.2 | 29.2 | | | | |
| 113 | | | | | | | 25 | 8 | | 4.4 | 37.4 | | | | |
| 114 | | | | | | 57 | | | | | 57 | | | | |

TABLE 4-3

| | | Wire Properties | | | | | | | | |
|---|---|---|---|---|---|---|---|---|---|---|
| | | Film Thickness of the Pd Coating Layer (μm) | Film Thickness of the Alloy Skin Layer Containing Au and Pd (μm) | Quality Evaluation Results | | | | | | |
| | | | | | | HTS | | | | |
| | No. | | | HAST | Low Concentration Sulfur-Containing Resin | High Concentration Sulfur-Containing Resin | FAB Shape | Wedge Bondability | Crushed Shape | Chip Damage |
| Inventive Example | 86 | 0.050 | — | ◉ | ◉ | ◉ | ◉ | Δ | ○ | ◉ |
| | 87 | 0.150 | 0.003 | ◉◉ | ◉ | ◉ | ○ | ◉ | ○ | ◉ |
| | 88 | 0.015 | 0.01 | ◉ | ◉ | ◉ | ◉ | ◉ | ◉ | ○ |
| | 89 | 0.100 | 0.003 | ◉◉ | ◉ | ◉ | Δ | ◉ | ◉ | ◉ |
| | 90 | 0.050 | 0.001 | ◉◉ | ◉ | ◉ | ◉ | ◉ | ◉ | ○ |
| | 91 | 0.150 | 0.08 | ◉ | ◉ | ◉ | ○ | ◉ | ○ | ○ |
| | 92 | 0.050 | 0.003 | ◉ | ◉ | ◉ | ◉ | ◉ | ○ | ○ |
| | 93 | 0.015 | 0.08 | ○ | ◉ | ◉ | ◉ | ◉ | ○ | ○ |
| | 94 | 0.150 | 0.01 | ◉ | ◉ | ◉ | ○ | ◉ | ○ | ○ |
| | 95 | 0.100 | 0.01 | ◉ | ◉ | ◉ | ◉ | ◉ | ○ | ○ |
| | 96 | 0.100 | — | ◉ | ◉ | ◉ | ◉ | Δ | ○ | ○ |
| | 97 | 0.015 | 0.05 | ○ | ◉ | ◉ | ◉ | ◉ | ○ | ○ |
| | 98 | 0.150 | 0.05 | ◉ | ◉ | ◉ | ○ | ◉ | ○ | ○ |
| | 99 | 0.100 | — | ◉ | ◉ | ◉ | ◉ | Δ | ○ | ○ |
| | 100 | 0.015 | 0.01 | ○ | ◉ | ◉ | ◉ | ◉ | ○ | ○ |
| | 101 | 0.150 | 0.01 | ◉ | ◉ | ◉ | ○ | ◉ | ○ | ○ |
| | 102 | 0.050 | 0.01 | ◉ | ◉ | ◉ | ◉ | ◉ | ○ | ○ |
| | 103 | 0.105 | 0.0005 | ◉ | ◉ | ◉ | ◉ | ○ | ○ | ◉ |
| | 104 | 0.050 | 0.001 | ◉ | ◉ | ◉ | ◉ | ◉ | ○ | ◉ |
| | 105 | 0.015 | 0.0005 | ○ | ◉ | ◉ | ◉ | ○ | ○ | ◉ |
| | 106 | 0.100 | 0.01 | ○ | ◉ | ◉ | ◉ | ◉ | ○ | ◉ |
| | 107 | 0.150 | 0.05 | ○ | ◉ | ◉ | ○ | ◉ | ○ | ◉ |
| | 108 | 0.100 | 0.05 | ◉ | ◉ | ◉ | ◉ | ◉ | ○ | ◉ |
| | 109 | 0.100 | 0.01 | ◉ | ◉ | ◉ | Δ | Δ | ○ | ◉ |
| | 110 | 0.150 | 0.003 | ◉ | ◉ | ◉ | Δ | Δ | ○ | ◉ |
| | 111 | 0.015 | 0.05 | ○ | ◉ | ◉ | Δ | Δ | ○ | ◉ |
| | 112 | 0.015 | 0.01 | ○ | ◉ | ◉ | ◉ | ◉ | ○ | ◉ |
| | 113 | 0.050 | 0.08 | ◉ | ◉ | ◉ | ◉ | ◉ | ○ | ◉ |
| | 114 | 0.150 | 0.001 | ◉ | ◉ | ◉ | ○ | ◉ | ○ | ◉ |

TABLE 5-1

Component Content (Pd is in the core material, otherwise in the wire)

| | | $M_1^+$: First$^+$ Alloy Elements Group (% by mass) | | | | | $M_2$: Second Alloy Element Group (% by mass) | | | | | | | | | | | | |
|---|---|---|---|---|---|---|---|---|---|---|---|---|---|---|---|---|---|---|---|---|
| | | $M_1$: First Alloy Element Group (% by mass) | | | | $M_1^+$ | | | | | | | | | | | | $M_2$ | $M_1 +$ |
| | No. | Ni | Rh | Ir | Pd | Total | Li | Sb | Fe | Cr | Co | Zn | Ca | Mg | Pt | Sc | Y | Total | Zn |
| Inventive Example | 115 | 1.20 | | | | 1.20 | | | | | | | | | | 0.015 | | 0.015 | |
| | 116 | 0.80 | | | | 0.80 | | | | | | | | | | 0.05 | | 0.05 | |
| | 117 | | 1.20 | | | 1.20 | | | | | | | | | | 1.8 | | 1.8 | |
| | 118 | | | 1.20 | | 1.20 | | | | | | | | | | | 0.015 | 0.015 | |
| | 119 | | | | 1.20 | 1.20 | | | | | | | | | | | 0.08 | 0.08 | |
| | 120 | | 0.80 | | | 0.80 | | | | | | | | | | | 1.8 | 1.8 | |
| | 121 | 1.20 | 0.50 | | | 1.70 | | | | 0.3 | | | | | | 0.3 | | 0.6 | |
| | 122 | 1.20 | 0.50 | | | 1.70 | | | | | | | | 0.3 | | 0.3 | | 0.6 | |
| | 123 | | 1.20 | 0.50 | | 1.70 | | | | | 0.3 | | | | | | 0.3 | 0.6 | |
| | 124 | | 1.20 | 0.50 | | 1.70 | | | | | | 0.3 | | | | | 0.3 | 0.6 | 2.00 |
| | 125 | | | | 0.80 | 0.80 | 0.5 | | | | | | | | | 1.6 | | 2.1 | |
| | 126 | | | | 0.80 | 0.80 | | 0.5 | | | | | | | | 1.6 | | 2.1 | |
| | 127 | | | | 0.80 | 0.80 | | | 0.5 | | | | | | | 1.6 | | 2.1 | |

TABLE 5-2

Component Core (in the wire)

| | | Third Alloy Element Group (% by mass) | | | | | Fourth Alloy Element Group (ppm by mass) | | | | | | Fifth Alloy Element Group (ppm by mass) | | | |
|---|---|---|---|---|---|---|---|---|---|---|---|---|---|---|---|---|
| | | | | | | Third | | | | | | Fourth | | | | Fifth |
| | No. | Al | Ga | Ge | In | Total | As | Te | Sn | Bi | Se | Total | B | P | La | Total |
| Inventive Example | 115 | 0.1 | | | | 0.1 | | 2.1 | | | | 2.1 | | | | |
| | 116 | | 0.8 | | | 0.8 | | | 2.5 | | | 2.5 | | | | |
| | 117 | | | 0.2 | | 0.2 | | | | | 3.6 | 3.6 | 50 | | | 50 |
| | 118 | | | | 0.08 | 0.08 | | | | 1 | | 1 | | 100 | | 100 |
| | 119 | | | | | 0 | | | 6.8 | | | 6.8 | | | 1 | 1 |
| | 120 | | | | | 0 | 20 | | | | | 20 | 50 | | | 50 |
| | 121 | | | | | 0 | | 25 | | | | 25 | | 100 | | 100 |
| | 122 | 0.05 | | | | 0.05 | | | | | 35 | 35 | | | 1 | 1 |
| | 123 | | 0.8 | | | 0.8 | | | | 0.2 | | 0.2 | | | | |
| | 124 | | | 0.3 | | 0.3 | | | | | 700 | 700 | | | | |
| | 125 | | | | 2.1 | 2.1 | | | | | | 0 | 50 | | | 50 |
| | 126 | | 1.8 | | | 1.8 | | | | | | 0 | | 100 | | 100 |
| | 127 | | | 1.3 | | 1.3 | | | | | | 0 | | | 1 | 1 |

TABLE 5-3

| | | Wire Properties | | Quality Evaluation Results | | | | | | |
|---|---|---|---|---|---|---|---|---|---|---|
| | | Film Thickness of the Film Pd Coating Layer (μm) | Film Thickness of the Alloy Skin Layer Containing Au and Pd (μm) | HAST | HTS Low Concentration Sulfur-Containing Resin | HTS High Concentration Sulfur-Containing Resin | FAB Shape | Wedge Bond-ability | Crushed Shape | Chip Damage |
| | No. | | | | | | | | | |
| Inventive Example | 115 | 0.050 | — | Δ | ⊚ | ○ | ⊚ | Δ | ○ | ⊚ |
| | 116 | 0.015 | 0.003 | Δ | ⊚ | ⊚ | ⊚ | ⊚ | ○ | ⊚ |
| | 117 | 0.150 | 0.01 | ⊚⊚ | ⊚ | ⊚ | ⊚ | ⊚ | ⊚ | ⊚ |
| | 118 | 0.100 | 0.003 | ⊚ | ⊚ | ○ | ⊚ | ⊚ | ⊚ | ⊚ |
| | 119 | 0.100 | 0.001 | ○ | ⊚ | ⊚ | ⊚ | ⊚ | ⊚ | ⊚ |
| | 120 | 0.015 | 0.08 | Δ | ⊚ | ⊚ | ⊚ | ⊚ | ⊚ | ⊚ |

TABLE 5-3-continued

| | Wire Properties | | | Quality Evaluation Results | | | | | |
|---|---|---|---|---|---|---|---|---|---|
| | Film Thickness of the Pd Coating Layer (μm) | Film Thickness of the Alloy Skin Layer Containing Au and Pd (μm) | HAST | HTS Low Concentration Sulfur-Containing Resin | HTS High Concentration Sulfur-Containing Resin | FAB Shape | Wedge Bondability | Crushed Shape | Chip Damage |
| No. | | | | | | | | | |
| 121 | 0.150 | 0.003 | ○ | ⊚ | ⊚ | ⊚ | ⊚ | ⊚ | ⊚ |
| 122 | 0.015 | 0.08 | Δ | ⊚ | ⊚ | ⊚ | ⊚ | ⊚ | ⊚ |
| 123 | 0.050 | 0.01 | ⊚⊚ | ⊚ | ⊚ | ⊚ | ⊚ | ○ | ⊚ |
| 124 | 0.150 | 0.01 | ⊚⊚ | ⊚ | ⊚ | ⊚ | ⊚ | ○ | ⊚ |
| 125 | 0.015 | — | Δ | ⊚ | ⊚ | ○ | Δ | ⊚ | ○ |
| 126 | 0.100 | 0.05 | ○ | ⊚ | ⊚ | ○ | ⊚ | ⊚ | ○ |
| 127 | 0.050 | 0.005 | ○ | ⊚ | ⊚ | ○ | ○ | ⊚ | ○ |

TABLE 6-1

Component Content (Pd is in the core material, otherwise in the wire)

| | | $M_1$: First Alloy Element Group (% by mass) | | | $M_1^+$ | $M_2$: Second Alloy Element Group (% by mass) | | | |
|---|---|---|---|---|---|---|---|---|---|
| | No. | Ni | Rh | Ir | Pd | Total | Li | Sb | Fe | Cr |
| Comparative Example | 1 | 0.01 | | | | 0.01 | 0.001 | | | |
| | 2 | 0.02 | | | | 0.02 | | 0.001 | | |
| | 3 | | 0.01 | | | 0.01 | | | 0.001 | |
| | 4 | | | 0.01 | | 0.01 | | | | 0.001 |
| | 5 | | | | 0.02 | 0.02 | | | | |
| | 6 | 0.05 | | | | 0.05 | | | | |
| | 7 | | 0.05 | | | 0.05 | | | | |
| | 8 | | 0.05 | | | 0.05 | | | | |
| | 9 | | | 0.05 | | 0.05 | | | | |
| | 10 | 2.30 | | | | 2.30 | | | | |
| | 11 | | | 1.10 | | 1.10 | | | | |
| | 12 | | 0.01 | | | 0.01 | | | | |
| | 13 | | | 2.40 | | 2.40 | | | | |
| | 14 | | | | 0.05 | 0.05 | 3.2 | | | |
| | 15 | 1.50 | | | | 1.50 | | | | 3.1 |

| | | $M_2$: Second Alloy Element Group (% by mass) | | | | | | | $M_2$ Total | $M_1^+ +$ Zn |
|---|---|---|---|---|---|---|---|---|---|---|
| | No. | Co | Zn | Ca | Mg | Pt | Sc | Y | | |
| Comparative Example | 1 | | | | | | | | 0.001 | |
| | 2 | | | | | | | | 0.001 | |
| | 3 | | | | | | | | 0.001 | |
| | 4 | | | | | | | | 0.001 | |
| | 5 | 0.001 | | | | | | | 0.001 | |
| | 6 | | 0.001 | | | | | | 0.001 | |
| | 7 | | | 0.005 | | | | | 0.005 | |
| | 8 | | | | 0.005 | | | | 0.005 | |
| | 9 | | 1.8 | | | | | | 1.8 | 1.85 |
| | 10 | | | | | | | | — | |
| | 11 | | | | | | | | — | |
| | 12 | | | | | | | | — | |
| | 13 | | | | | | | | — | |
| | 14 | | | | 0.001 | | | | 3.201 | |
| | 15 | | | | | | | | 3.1 | |

TABLE 6-2

| | | Component Core (in the wire) | | | | | | | | | | | | |
|---|---|---|---|---|---|---|---|---|---|---|---|---|---|---|
| | | Third Alloy Element Group (% by mass) | | | | Third Total | Fourth Alloy Element Group (ppm by mass) | | | | | Fourth Total | Fifth Alloy Element Group (ppm by mass) | | | Fifth Total |
| | No. | Al | Ga | Ge | In | Total | As | Te | Sn | Bi | Se | Total | B | P | La | Total |
| Comparative Example | 1 | | | | | | | | | | | | | | | |
| | 2 | | | | | | | | | | | | | | | |
| | 3 | | | | | | | | | | | | | | | |
| | 4 | | | | | | | | | | | | | | | |
| | 5 | | | | | | | | | | | | | | | |
| | 6 | | | | | | | | | | | | | | | |
| | 7 | | | | | | | | | | | | | | | |
| | 8 | | | | | | | | | | | | | | | |
| | 9 | | | | | | | | | | | | | | | |
| | 10 | | | | | | | | | | | | | | | |
| | 11 | | | | | | | | | | | | | | | |
| | 12 | | | | | | | | | | | | | | | |
| | 13 | | | | | | | | | | | | | | | |
| | 14 | | | | | | | | | | | | | | | |
| | 15 | | | | | | | | | | | | | | | |

TABLE 6-3

| | | Wire Properties | | | Quality Evaluation Results | | | | | | |
|---|---|---|---|---|---|---|---|---|---|---|---|
| | | Film Thickness of the Pd Coating Layer (μm) | Film Thickness of the Alloy Skin Layer Containing Au and Pd (μm) | HAST | HTS Low Concentration Sulfur-Containing Resin | HTS High Concentration Sulfur-Containing Resin | FAB Shape | Wedge Bond-ability | Crushed Shape | Chip Damage |
| | No. | | | | | | | | | |
| Comparative Example | 1 | 0.015 | 0.05 | X | X | X | ◎ | ◎ | ○ | ◎ |
| | 2 | 0.050 | 0.003 | X | X | X | ◎ | ◎ | ○ | ◎ |
| | 3 | 0.050 | 0.01 | X | X | X | ◎ | ◎ | ○ | ◎ |
| | 4 | 0.150 | 0.08 | X | X | X | ○ | ◎ | ○ | ◎ |
| | 5 | 0.050 | 0.05 | X | X | X | ◎ | ◎ | ○ | ◎ |
| | 6 | 0.050 | 0.05 | Δ | Δ | X | Δ | ◎ | ○ | ◎ |
| | 7 | 0.100 | 0.01 | Δ | Δ | X | ◎ | ◎ | ○ | ◎ |
| | 8 | 0.050 | 0.01 | Δ | Δ | X | ◎ | ◎ | ○ | ◎ |
| | 9 | 0.100 | 0.003 | Δ | Δ | X | ◎ | ◎ | ○ | ◎ |
| | 10 | 0.015 | 0.08 | X | ◎ | X | ◎ | ◎ | ○ | X |
| | 11 | 0.150 | 0.01 | Δ | ◎ | X | ○ | ◎ | ○ | ◎ |
| | 12 | 0.050 | 0.001 | Δ | X | X | ◎ | ◎ | ○ | ◎ |
| | 13 | 0.050 | 0.08 | Δ | ◎ | X | ◎ | ◎ | ○ | X |
| | 14 | 0.050 | — | Δ | ◎ | ◎ | ◎ | Δ | ○ | X |
| | 15 | 0.015 | 0.003 | X | ◎ | ◎ | ◎ | ◎ | ○ | ◎ |

The results are shown in Tables 1-1 to 6-3. Inventive example Nos. 1 to 127 in Tables 1-1 to 5-3 are examples of the present invention, and Comparative Example Nos. 1 to 15 in Tables 6-1 to 6-3 are comparative examples. Numerical values outside the scope of the present invention are underlined.

Inventive example Nos. 1 to 127 in Tables 1-1 to 5-3 are bonding wires for a semiconductor device having a Cu alloy core material and a Pd coating layer formed on the surface of the Cu alloy core material, wherein the component composition of the wire falls within the scope of the present invention, in which good results were obtained in all evaluation items of the results of HAST, the results of HST (in both the low concentration of the sulfur-containing resin and the high concentration of the sulfur-containing resin), the FAB shape, the wedge bondability, the crushed shape of the ball bonded portion and the chip damage.

Comparative example Nos. 1 to 15 in Tables 6-1 to 6-3 will be explained. In comparative Example Nos. 1 to 5 and 12, the content of the first+alloy elements group was out of the lower limit of the range of the present invention, and both HAST and HTS (including the low concentration of the sulfur-containing resin) were failure.

In comparative Example Nos. 6 to 8 and 11, although the content of the first+alloy elements group is within the range of the present invention, the content of the second alloy element group is out of the lower limit of the range of the present invention, and in comparative Example No. 9, Zn is contained and the total content of the first alloy element group and Zn is out of the range of the present invention, and the results of HTS in using the high concentration of the sulfur-containing resin were failure in all cases.

In Comparative Example Nos. 10 and 13 to 15, the content of either the first alloy elements group or the second alloy element group was out of the upper limit of the range of the present invention, and chip damage was failure.

The invention claimed is:

1. A bonding wire for a semiconductor device, the bonding wire comprising: a Cu alloy core material; and a Pd coating layer formed on a surface of the Cu alloy core material, wherein the bonding wire contains at least one of first alloy element group and Pd, and the first alloy element group is one or more elements selected from the group consisting of Ni, Rh, and Ir, wherein a total content of the first alloy element group and Pd is 0.03 to 2% by mass, a content of the first alloy element group is a content of the first alloy element group in an entirety of the bonding wire, a content of Pd is a content of Pd in the Cu alloy core material only, and in a case of absence of the first alloy element group, the content of Pd in the Cu alloy core material is 0.05% by mass or more, and wherein the bonding wire contains 0.1% by mass or more to 3% by mass of Mg.

2. The bonding wire for a semiconductor device according to claim 1, wherein a thickness of the Pd coating layer is 0.015 to 0.150 μm.

3. The bonding wire for a semiconductor device according to claim 2, further comprising an alloy skin layer containing Au and Pd on the Pd coating layer.

4. The bonding wire for a semiconductor device according to claim 1, further comprising an alloy skin layer containing Au and Pd on the Pd coating layer.

5. The bonding wire for a semiconductor device according to claim 4, wherein a thickness of the alloy skin layer containing Au and Pd is 0.050 μm or less.

6. The bonding wire for a semiconductor device according to claim 1, wherein the bonding wire further contains 0.03 to 3% by mass in total of one or more elements selected from Al, Ga, Ge and In.

7. The bonding wire for a semiconductor device according to claim 6, wherein the bonding wire further contains 0.03 to 3% by mass in total of one or more elements selected from Al and In.

8. The bonding wire for a semiconductor device according to claim 1, wherein the bonding wire further contains 0.1 to 1000 ppm by mass in total of one or more elements selected from As, Te, Sn, Bi and Se, where at least one of the following conditions: (a) when Sn is present, a content of Sn is 10 ppm or less; and (b) when Bi is present, a content of Bi is 1 ppm or less is satisfied.

9. The bonding wire for a semiconductor device according to claim 1, wherein the bonding wire further contains 0.1 to 200 ppm by mass in total of one or more elements selected from B, P and La.

10. The bonding wire for a semiconductor device according to claim 9, wherein the bonding wire further contains 0.1 to 200 ppm by mass in total of La.

11. The bonding wire for a semiconductor device according to claim 1, wherein Cu is present at an outermost surface of the bonding wire.

12. The bonding wire for a semiconductor device according to claim 1, wherein the first alloy element group contains Rh.

13. The bonding wire for a semiconductor device according to claim 1, wherein the bonding wire contains 0.002 to 3% by mass in total of one or more elements selected from Li, Sb, Fe, Cr, Co, Zn, Ca, Sc and Y.

* * * * *